US012558873B2

(12) United States Patent
Ji et al.

(10) Patent No.: US 12,558,873 B2
(45) Date of Patent: Feb. 24, 2026

(54) HOUSING, TERMINAL DEVICE, AND HOUSING MANUFACTURING METHOD

(71) Applicant: Huawei Technologies Co., Ltd., Shenzhen (CN)

(72) Inventors: Dawei Ji, Dongguan (CN); Ming Cai, Dongguan (CN); Banghong Hu, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/502,254

(22) Filed: Nov. 6, 2023

(65) Prior Publication Data

US 2024/0075710 A1     Mar. 7, 2024

Related U.S. Application Data

(63) Continuation of application No. PCT/CN2022/091242, filed on May 6, 2022.

(30) Foreign Application Priority Data

May 8, 2021   (CN) .......................... 202110502253.9

(51) Int. Cl.
B32B 15/01 (2006.01)
C23C 28/02 (2006.01)
H05K 5/04 (2006.01)

(52) U.S. Cl.
CPC .......... B32B 15/017 (2013.01); C23C 28/021 (2013.01); C23C 28/023 (2013.01); C23C 28/028 (2013.01); H05K 5/04 (2013.01)

(58) Field of Classification Search
None
See application file for complete search history.

(56) References Cited

U.S. PATENT DOCUMENTS

2016/0324026 A1* 11/2016 Kang ................... H04M 1/0283

FOREIGN PATENT DOCUMENTS

| CN | 107227459 | A | | 10/2017 |
|---|---|---|---|---|
| CN | 110581344 | A | | 12/2019 |
| CN | 108188523 | B | | 8/2020 |
| JP | 2007138257 | A | | 6/2007 |
| JP | 2019166659 | A | * | 10/2019 |
| WO | 2017115661 | A1 | | 7/2017 |
| WO | 2020184489 | A1 | | 9/2020 |

* cited by examiner

*Primary Examiner* — Daniel J. Schleis
(74) *Attorney, Agent, or Firm* — Slater Matsil, LLP

(57) ABSTRACT

This application provides a housing, a terminal device, and a housing manufacturing method. The housing includes a magnesium-based metal matrix. A first aluminum-based metal layer and a second aluminum-based metal layer are respectively disposed on two sides of the magnesium-based metal matrix, a first transition layer is disposed between the magnesium-based metal matrix and the first aluminum-based metal layer, an appearance layer is disposed on a surface of a side that is of the first aluminum-based metal layer and that is away from the first transition layer, a second transition layer is disposed between the magnesium-based metal matrix and the second aluminum-based metal layer, and an electrical connection layer is disposed on a surface of a side that is of the second aluminum-based metal layer and that is away from the second transition layer.

20 Claims, 11 Drawing Sheets

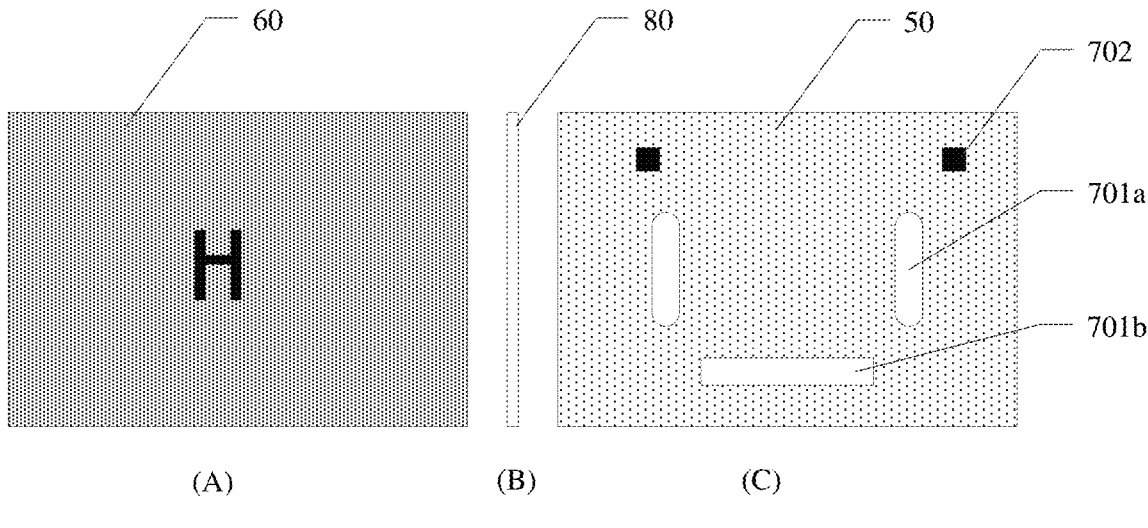

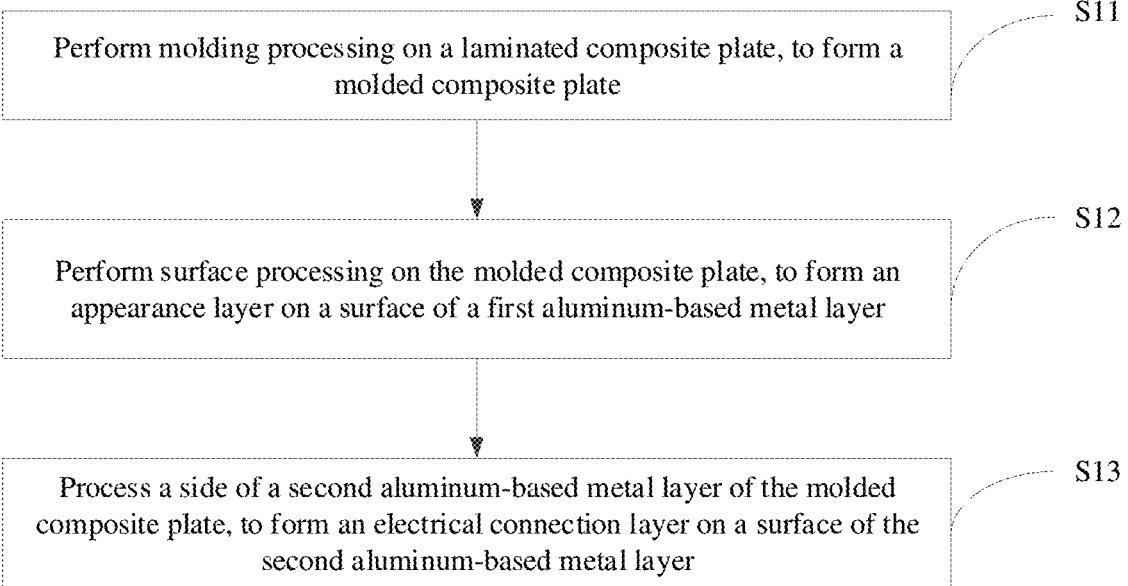

S11
Perform molding processing on a laminated composite plate, to form a molded composite plate S12
Perform surface processing on the molded composite plate, to form an appearance layer on a surface of a first aluminum-based metal layer S13
Process a side of a second aluminum-based metal layer of the molded composite plate, to form an electrical connection layer on a surface of the second aluminum-based metal layer

FIG. 4

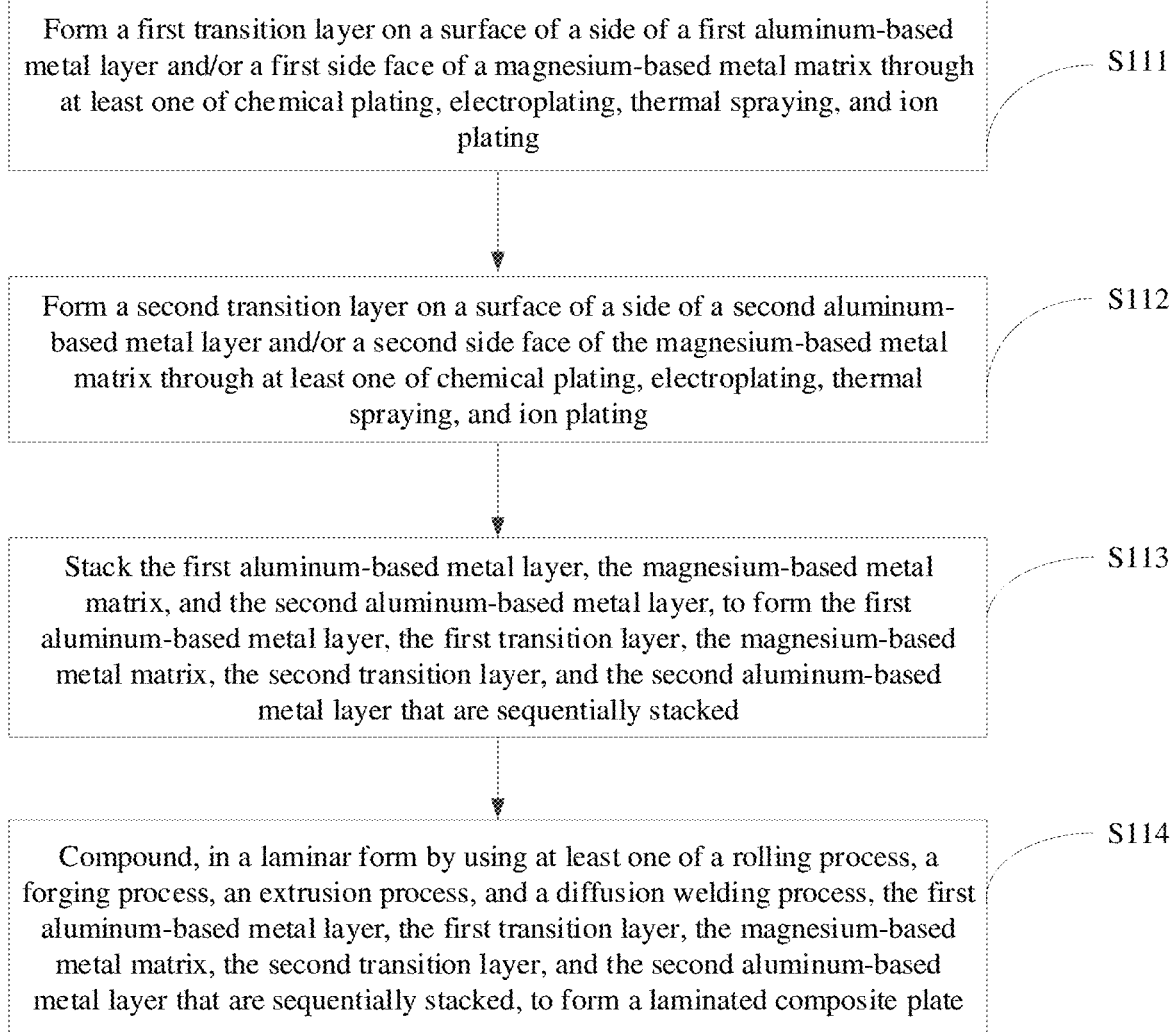

Form a first transition layer on a surface of a side of a first aluminum-based metal layer and/or a first side face of a magnesium-based metal matrix through at least one of chemical plating, electroplating, thermal spraying, and ion plating — S111

Form a second transition layer on a surface of a side of a second aluminum-based metal layer and/or a second side face of the magnesium-based metal matrix through at least one of chemical plating, electroplating, thermal spraying, and ion plating — S112

Stack the first aluminum-based metal layer, the magnesium-based metal matrix, and the second aluminum-based metal layer, to form the first aluminum-based metal layer, the first transition layer, the magnesium-based metal matrix, the second transition layer, and the second aluminum-based metal layer that are sequentially stacked — S113

Compound, in a laminar form by using at least one of a rolling process, a forging process, an extrusion process, and a diffusion welding process, the first aluminum-based metal layer, the first transition layer, the magnesium-based metal matrix, the second transition layer, and the second aluminum-based metal layer that are sequentially stacked, to form a laminated composite plate — S114

FIG. 5

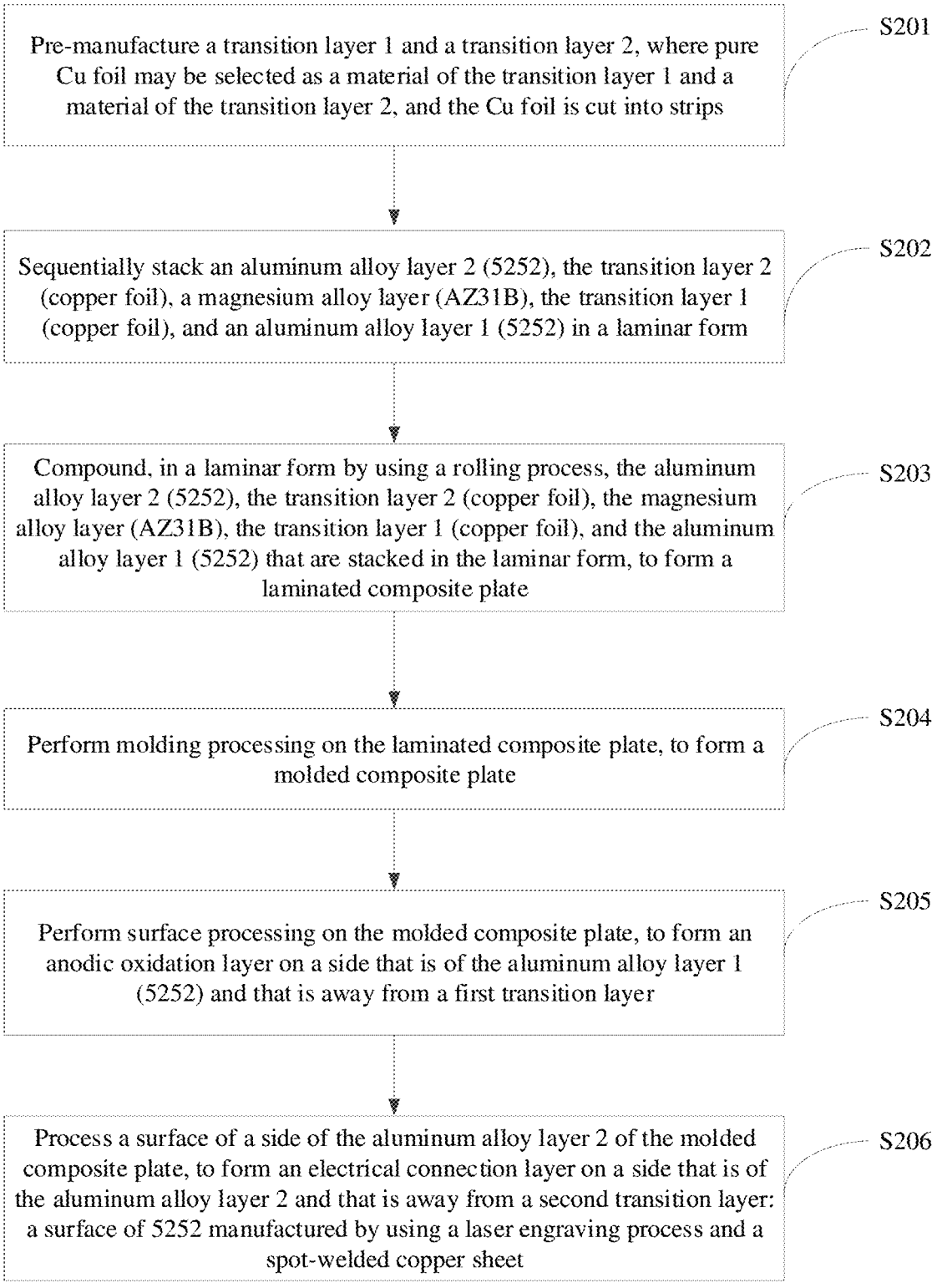

Pre-manufacture a transition layer 1 and a transition layer 2, where pure Cu foil may be selected as a material of the transition layer 1 and a material of the transition layer 2, and the Cu foil is cut into strips — S201

Sequentially stack an aluminum alloy layer 2 (5252), the transition layer 2 (copper foil), a magnesium alloy layer (AZ31B), the transition layer 1 (copper foil), and an aluminum alloy layer 1 (5252) in a laminar form — S202

Compound, in a laminar form by using a rolling process, the aluminum alloy layer 2 (5252), the transition layer 2 (copper foil), the magnesium alloy layer (AZ31B), the transition layer 1 (copper foil), and the aluminum alloy layer 1 (5252) that are stacked in the laminar form, to form a laminated composite plate — S203

Perform molding processing on the laminated composite plate, to form a molded composite plate — S204

Perform surface processing on the molded composite plate, to form an anodic oxidation layer on a side that is of the aluminum alloy layer 1 (5252) and that is away from a first transition layer — S205

Process a surface of a side of the aluminum alloy layer 2 of the molded composite plate, to form an electrical connection layer on a side that is of the aluminum alloy layer 2 and that is away from a second transition layer: a surface of 5252 manufactured by using a laser engraving process and a spot-welded copper sheet — S206

FIG. 10

Anodic oxidation layer
5252
Copper
AZ31B
Copper
5252

Surface of 5252 manufactured by using a laser engraving process

Copper sheet

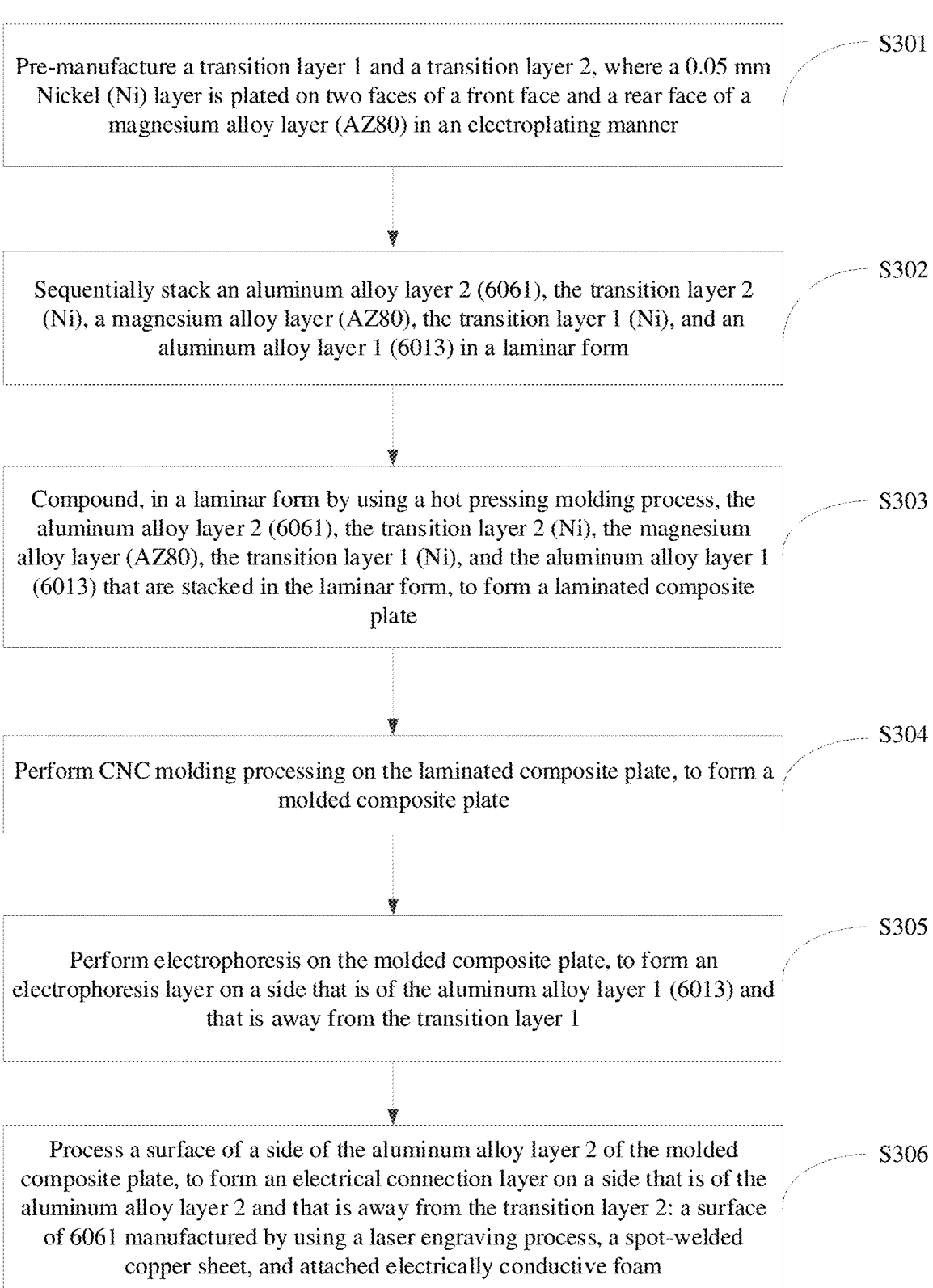

Pre-manufacture a transition layer 1 and a transition layer 2, where a 0.05 mm Nickel (Ni) layer is plated on two faces of a front face and a rear face of a magnesium alloy layer (AZ80) in an electroplating manner

S301

Sequentially stack an aluminum alloy layer 2 (6061), the transition layer 2 (Ni), a magnesium alloy layer (AZ80), the transition layer 1 (Ni), and an aluminum alloy layer 1 (6013) in a laminar form

S302

Compound, in a laminar form by using a hot pressing molding process, the aluminum alloy layer 2 (6061), the transition layer 2 (Ni), the magnesium alloy layer (AZ80), the transition layer 1 (Ni), and the aluminum alloy layer 1 (6013) that are stacked in the laminar form, to form a laminated composite plate

S303

Perform CNC molding processing on the laminated composite plate, to form a molded composite plate

S304

Perform electrophoresis on the molded composite plate, to form an electrophoresis layer on a side that is of the aluminum alloy layer 1 (6013) and that is away from the transition layer 1

S305

Process a surface of a side of the aluminum alloy layer 2 of the molded composite plate, to form an electrical connection layer on a side that is of the aluminum alloy layer 2 and that is away from the transition layer 2: a surface of 6061 manufactured by using a laser engraving process, a spot-welded copper sheet, and attached electrically conductive foam

HOUSING, TERMINAL DEVICE, AND HOUSING MANUFACTURING METHOD

CROSS-REFERENCE TO RELATED APPLICATIONS

This application is a continuation of International Application No. PCT/CN2022/091242, filed on May 6, 2022, which claims priority to Chinese Patent Application No. 202110502253.9, filed on May 8, 2021. The disclosures of the aforementioned applications are hereby incorporated by reference in their entireties.

TECHNICAL FIELD

This application relates to the terminal device packaging field, and in particular, to a housing, a terminal device, and a housing manufacturing method.

BACKGROUND

As a terminal product develops toward lightness and thinness, it is of important practical significance and application value to develop a light composite metal housing. A magnesium alloy is a lightest metal structure material (a density of magnesium is 1.8 g/cm$^3$), and is applied to the terminal product, to reduce a weight of the terminal product obviously. However, due to a characteristic of the magnesium alloy, the magnesium alloy cannot be directly used as an anodic oxidation appearance decoration like an aluminum alloy. Currently, surface processing performed on the magnesium alloy is basically paint spraying. In such a surface processing manner, there are disadvantages such as a poor appearance texture, poor scratch resistance, poor corrosion resistance, poor reliability, poor electrical connectivity, low strength, and poor rigidity. The aluminum alloy has rich appearance colors due to anodic oxidation and has advantages such as a metal texture, a cold sense of touch, high reliability, wear resistance, and corrosion resistance, and therefore, is widely applied to housings of various terminal devices.

To improve decorativeness of the magnesium alloy, a researcher covers a surface of the magnesium alloy with a layer of aluminum alloy, to manufacture a magnesium/aluminum laminated composite plate. However, a brittle phase is easily formed between magnesium and aluminum, resulting in low interface bonding strength. Subsequently, disadvantages such as layering and deformation easily occur during molding of a housing. In addition, there is a problem that a magnesium alloy exposed on a single side easily galvanically corrodes with an aluminum alloy, a problem that reliability of an electrical connection is poor, and the like. Therefore, requirements of the housing for a light weight, a good look, high wear resistance, high reliability, high strength, high rigidity, good corrosion resistance, and good electrical connectivity cannot be met.

SUMMARY

This application provides a housing, a terminal device, and a housing manufacturing method, so that the housing has a light weight, a good look, high wear resistance, high reliability, high strength, high rigidity, good corrosion resistance, and good electrical connectivity.

According to a first aspect, this application provides a housing, including a magnesium-based metal matrix. A first aluminum-based metal layer and a second aluminum-based metal layer are respectively disposed on two sides of the magnesium-based metal matrix, a first transition layer is disposed between the magnesium-based metal matrix and the first aluminum-based metal layer, an appearance layer is disposed on a surface of a side that is of the first aluminum-based metal layer and that is away from the first transition layer, a second transition layer is disposed between the magnesium-based metal matrix and the second aluminum-based metal layer, and an electrical connection layer is disposed on a surface of a side that is of the second aluminum-based metal layer and that is away from the second transition layer.

Both shear and peel strength between the first transition layer and the magnesium-based metal matrix and shear and peel strength between the first transition layer and the first aluminum-based metal layer are greater than first shear and peel strength, the first shear and peel strength is shear and peel strength between two metals of a magnesium-based metal and an aluminum-based metal in an aluminum-magnesium composite material, and both shear and peel strength between the second transition layer and the magnesium-based metal matrix and shear and peel strength between the second transition layer and the second aluminum-based metal layer are greater than the first shear and peel strength.

The housing provided in this application includes the magnesium-based metal matrix, the first transition layer, the first aluminum-based metal layer, the appearance layer, the second transition layer, the second aluminum-based metal layer, and the electrical connection layer. Because the magnesium-based metal matrix has a low density, the housing may have a light weight. The first transition layer is disposed between the magnesium-based metal matrix and the first aluminum-based metal layer, and both the shear and peel strength between the first transition layer and the magnesium-based metal matrix and the shear and peel strength between the first transition layer and the first aluminum-based metal layer are greater than the first shear and peel strength. Compared with an aluminum-magnesium composite material in which two metals of a magnesium-based metal and an aluminum-based metal are directly bonded in the conventional technology, in a solution of this application, the first transition layer may be used to increase an interface bonding force between the magnesium-based metal matrix and the first aluminum-based metal layer, to avoid layering that occurs when a force is exerted in a subsequent process of molding or using the housing. The second transition layer is disposed between the magnesium-based metal matrix and the second aluminum-based metal layer, and both the shear and peel strength between the second transition layer and the magnesium-based metal matrix and the shear and peel strength between the second transition layer and the second aluminum-based metal layer are greater than the first shear and peel strength. Compared with the aluminum-magnesium composite material in which the two metals of the magnesium-based metal and the aluminum-based metal are directly bonded in the conventional technology, in the solution of this application, the first transition layer may be used to increase an interface bonding force existing after the magnesium-based metal matrix and the second aluminum-based metal layer are compounded, to avoid layering that occurs when a force is exerted in a subsequent process of molding or using the housing. The first aluminum-based metal layer and the second aluminum-based metal layer may provide high wear resistance, high reliability, high strength, high rigidity, and good corrosion resistance for the housing. In addition, the first aluminum-based metal layer may provide an aluminum matrix for the appearance layer, the appearance layer may provide a good look for the housing, the second aluminum-based metal layer may provide an aluminum matrix for the electrical connection layer, and the electrical connection layer may provide good electrical connectivity for the housing. Therefore, the housing in this application can have a light weight, a good look, high wear resistance, high reliability, high strength, high rigidity, good corrosion resistance, and good electrical connectivity.

In a possible implementation of this application, the appearance layer includes any one of an anodic oxidation layer, an electrophoresis layer, and an ink-jet printing layer. The appearance layer may meet a requirement of the housing for a good look, and may further improve corrosion resistance of the housing.

In a possible implementation of this application, a material of the magnesium-based metal matrix is selected from a wrought magnesium alloy that may be processed under pressure, and preferably, is selected from at least one of a magnesium-aluminum alloy, a magnesium-zinc alloy, or a magnesium-lithium alloy.

In a possible implementation of this application, a material of the first transition layer is selected from at least one of pure copper, a copper alloy, pure titanium, a titanium alloy, pure nickel, a nickel alloy, pure cobalt, a cobalt alloy, pure tantalum, a tantalum alloy, pure zinc, a zinc alloy, pure silver, or a silver alloy. Because the first transition layer exists between the first aluminum-based metal layer and the magnesium-based metal matrix in the housing, compared with the aluminum-magnesium composite material in which the two metals of the magnesium-based metal and the aluminum-based metal are directly bonded in the conventional technology, shear and peel strength of the housing can be improved. For example, shear and peel strength of a material obtained after three layers of the first aluminum-based metal layer, the first transition layer, and the magnesium-based metal matrix are compounded is greater than or equal to 30 MPa.

In a possible implementation of this application, a material of the second transition layer is selected from at least one of pure copper, a copper alloy, pure titanium, a titanium alloy, pure nickel, a nickel alloy, pure cobalt, a cobalt alloy, pure tantalum, a tantalum alloy, pure zinc, a zinc alloy, pure silver, or a silver alloy. Because the second transition layer exists between the second aluminum-based metal layer and the magnesium-based metal matrix in the housing, compared with the aluminum-magnesium composite material in which the two metals of the magnesium-based metal and the aluminum-based metal are directly bonded in the conventional technology, shear and peel strength of the housing can be improved. For example, shear and peel strength of a material obtained after three layers of the second aluminum-based metal layer, the second transition layer, and the magnesium-based metal matrix are compounded is greater than or equal to 30 MPa.

In a possible implementation of this application, the material of the first transition layer and the material of the second transition layer are a same material. Compared with a case in which different materials are used for the first transition layer and the second transition layer, in this implementation in which a same material is used for the first transition layer and the second transition layer, a process can be simplified.

In a possible implementation of this application, when a material of the first aluminum-based metal layer is selected, an aluminum-containing metal on which anodic oxidation may be performed may be selected, including but being not limited to at least one of a 1-series aluminum alloy, a 5-series aluminum alloy, a 6-series aluminum alloy, and a 7-series aluminum alloy. In an example, the 5-series aluminum alloy or the 6-series aluminum alloy is preferably selected.

In a possible implementation of this application, when a material of the second aluminum-based metal layer is selected, an aluminum-containing metal that may be plastically processed and deformed may be selected, including but being not limited to at least one of a 1-series aluminum alloy to an 8-series aluminum alloy. In an example, the 5-series aluminum alloy or the 6-series aluminum alloy is preferably selected.

In a possible implementation of this application, a thickness of the housing is T, a thickness of the magnesium-based metal matrix is greater than 0.25 T and less than or equal to 0.95 T, and T is a positive number. When a proportion of the thickness of the magnesium-based metal matrix to the housing ranges from 0.25 to 0.95, weight reduction, strength, and costs may be balanced, so that the housing meets different scenario requirements.

In a possible implementation of this application, the thickness of the housing is T, and a sum of a thickness of the first aluminum-based metal layer and a thickness of the second aluminum-based metal layer is greater than or equal to 0.05 T and less than or equal to 0.75 T. When a proportion of the sum of the thickness of the first aluminum-based metal layer and the thickness of the second aluminum-based metal layer to the thickness of the housing is 0.05 to 0.75, overall strength of the housing can be improved while a requirement for a light weight is met.

In a possible implementation of this application, the thickness of the first aluminum-based metal layer is greater than or equal to the thickness of the second aluminum-based metal layer. The thickness of the first aluminum-based metal layer is larger, and an aluminum matrix with a larger thickness may be provided for manufacturing the appearance layer, to meet various manufacturing requirements of a good-look appearance. For example, a high gloss chamfer may be manufactured at the first aluminum-based metal layer.

In a possible implementation of this application, the thickness of the housing is T, and a thickness of the first transition layer is greater than 0 and less than or equal to 0.2 T.

In a possible implementation of this application, the thickness of the housing is T, and a thickness of the second transition layer is greater than 0 and less than or equal to 0.2 T.

In a possible implementation of this application, a thickness of the appearance layer ranges from 5 μm to 60 μm.

In an embodiment, the thickness of the appearance layer when the appearance layer is an anodic oxidation layer may be between 5 μm and 16 μm. In another embodiment, the thickness of the appearance layer when the appearance layer is an electrophoresis layer may be between 10 μm and 60 μm. In still another embodiment, the thickness of the appearance layer when the appearance layer is an ink-jet printing layer may be between 10 μm and 60 μm.

In a possible implementation of this application, a material of the electrical connection layer is at least one of a partial computer numerical control (CNC) machining or laser engraving surface of the first aluminum-based metal layer, a copper sheet, or electrically conductive foam. The computer numerical control (CNC) machining or laser engraving surface of the first aluminum-based metal layer is used as the electrical connection layer, to meet a requirement of the housing for electrical connectivity. A spot-welded copper sheet of the first aluminum-based metal layer is used for an electrical connection, to meet the requirement of the housing for higher electrical connectivity.

In a possible implementation of this application, a thickness of the electrical connection layer ranges from 0.05 mm to 3 mm. In an embodiment, when the electrical connection layer is a copper layer including the spot-welded copper sheet, a thickness of the electrical connection layer is 0.05 mm or 0.08 mm.

According to a second aspect, this application further provides a housing manufacturing method. The manufacturing method includes the following steps: performing molding processing on a laminated composite plate, to form a molded composite plate, where the laminated composite plate includes a magnesium-based metal matrix, a first side face of the magnesium-based metal matrix is covered with a first transition layer, a side that is of the first transition layer and that is away from the magnesium-based metal matrix is covered with a first aluminum-based metal layer, a second side face of the magnesium-based metal matrix is covered with a second transition layer, a side that is of the second transition layer and that is away from the magnesium-based metal matrix is covered with a second aluminum-based metal layer, both shear and peel strength between the first transition layer and the magnesium-based metal matrix and shear and peel strength between the first transition layer and the first aluminum-based metal layer are greater than first shear and peel strength, the first shear and peel strength is shear and peel strength between two metals of a magnesium-based metal and an aluminum-based metal in an aluminum-magnesium composite material, and both shear and peel strength between the second transition layer and the magnesium-based metal matrix and shear and peel strength between the second transition layer and the second aluminum-based metal layer are greater than the first shear and peel strength; performing surface processing on the molded composite plate, to form an appearance layer on a surface of the first aluminum-based metal layer; and processing the molded composite plate, to form an electrical connection layer on a surface of the second aluminum-based metal layer.

A housing obtained in the manufacturing method in this application includes the magnesium-based metal matrix, the first transition layer, the first aluminum-based metal layer, the appearance layer, the second transition layer, the second aluminum-based metal layer, and the electrical connection layer. Because the magnesium-based metal matrix has a low density, the housing may have a light weight. The first transition layer is disposed between the magnesium-based metal matrix and the first aluminum-based metal layer, and both the shear and peel strength between the first transition layer and the magnesium-based metal matrix and the shear and peel strength between the first transition layer and the first aluminum-based metal layer are greater than the first shear and peel strength. Compared with an aluminum-magnesium composite material in which two metals of a magnesium-based metal and an aluminum-based metal are directly bonded in the conventional technology, in a solution of this application, the first transition layer may be used to increase an interface bonding force between the magnesium-based metal matrix and the first aluminum-based metal layer, to avoid layering that occurs when a force is exerted in a subsequent process of molding or using the housing. In this way, the housing is not easily deformed. The second transition layer is disposed between the magnesium-based metal matrix and the second aluminum-based metal layer, and both the shear and peel strength between the second transition layer and the magnesium-based metal matrix and the shear and peel strength between the second transition layer and the second aluminum-based metal layer are greater than the first shear and peel strength. Compared with the aluminum-magnesium composite material in which the two metals of the magnesium-based metal and the aluminum-based metal are directly bonded in the conventional technology, in the solution of this application, the first transition layer may be used to increase an interface bonding force existing after the magnesium-based metal matrix and the second aluminum-based metal layer are compounded, to avoid layering that occurs when a force is exerted in a subsequent process of molding or using the housing. In this way, the housing is not easily deformed. The first aluminum-based metal layer and the second aluminum-based metal layer may provide high wear resistance, high reliability, high strength, and high rigidity for the housing. In addition, the first aluminum-based metal layer may provide an aluminum matrix for the appearance layer, the appearance layer may provide a good look for the housing, the second aluminum-based metal layer may provide an aluminum matrix for the electrical connection layer, and the electrical connection layer may provide good electrical connectivity for the housing. Therefore, the housing in this application can have a light weight, a good look, high wear resistance, high reliability, high strength, high rigidity, good corrosion resistance, and good electrical connectivity.

In a possible implementation of this application, when the laminated composite plate is specifically manufactured, the first aluminum-based metal layer, the first transition layer, the magnesium-based metal matrix, the second transition layer, and the second aluminum-based metal layer that are sequentially stacked may be compounded in a laminar form by using at least one of a rolling process, a forging process, an extrusion process, and a diffusion welding process, to form the laminated composite plate.

In a possible implementation of this application, when the first aluminum-based metal layer, the first transition layer, the magnesium-based metal matrix, the second transition layer, and the second aluminum-based metal layer that are sequentially stacked are manufactured, at least one of chemical plating, electroplating, thermal spraying, ion plating, and diffusion welding may be used to form the first transition layer on a surface of a side of the first aluminum-based metal layer and/or a first side face of the magnesium-based metal matrix and form the second transition layer on a surface of a side of the second aluminum-based metal layer and/or a second side face of the magnesium-based metal matrix, the first aluminum-based metal layer, the magnesium-based metal matrix, and the second aluminum-based metal layer are stacked, to form the first aluminum-based metal layer, the first transition layer, the magnesium-based metal matrix, the second transition layer, and the second aluminum-based metal layer that are sequentially stacked. At least one of chemical plating, electroplating, thermal spraying, ion plating, and diffusion welding is used, so that there can be high bonding strength between the first transition layer and the surface of the side of the first aluminum-based metal layer and/or the first side face of the magnesium-based metal matrix, and there can be high bonding strength between the second transition layer and the surface of the side of the second aluminum-based metal layer and/or the second side face of the magnesium-based metal matrix.

In a possible implementation of this application, the performing surface processing on the molded composite plate, to form an appearance layer on a surface of the first aluminum-based metal layer includes: performing anodic oxidation processing on the molded composite plate, to form an anodic oxidation layer on the surface of the first aluminum-based metal layer. Through anodic oxidation processing, an appearance of the housing can meet a requirement for a good look, and corrosion resistance of the housing can be further improved.

In a possible implementation of this application, the performing surface processing on the molded composite plate, to form an appearance layer on a surface of the first aluminum-based metal layer includes: performing electrophoresis processing or ink-jet printing processing on the molded composite plate, to form the appearance layer on the surface of the first aluminum-based metal layer.

In a possible implementation of this application, the performing electrical connection processing on the molded composite plate, to form an electrical connection layer on a surface of the second aluminum-based metal layer includes: performing at least one of a computer digital control (CNC) process, a laser engraving process, a copper sheet spot welding process, or electrically conductive foam attaching on the molded composite plate, to form the electrical connection layer on the surface of the second aluminum-based metal layer. The partial computer numerical control (CNC) machining or laser engraving surface of the first aluminum-based metal layer is used as the electrical connection layer, to meet a requirement of the housing for electrical connectivity. A spot-welded copper sheet of the first aluminum-based metal layer is used as the electrical connection layer, to meet the requirement of the housing for higher electrical connectivity.

According to a third aspect, this application provides a terminal device. The terminal device includes the housing in the possible implementations of the first aspect of this application or the housing obtained in the manufacturing method in the possible implementations of the second aspect of this application.

The terminal device in this application includes but is not limited to a mobile phone, a notebook computer, and a tablet computer.

The terminal device in this application includes the housing the possible implementations of this application. Therefore, when the housing has a light weight, a good look, high wear resistance, high reliability, high strength, high rigidity, good corrosion resistance, and good electrical connectivity, the terminal device in this application also has a light weight, a good look, high wear resistance, high reliability, high strength, high rigidity, good corrosion resistance, and good electrical connectivity.

BRIEF DESCRIPTION OF THE DRAWINGS

FIG. 3 is a schematic diagram of a notebook computer housing according to an embodiment of this application;

FIG. 4 is a flowchart of a housing manufacturing method according to an embodiment of this application;

FIG. 5 is a flowchart of a laminated composite plate manufacturing method according to an embodiment of this application;

FIG. 10 is a flowchart of a housing manufacturing process according to an embodiment of this application;

FIG. 14 is a flowchart of a housing manufacturing process according to an embodiment of this application.

REFERENCE NUMERALS

Figure 1:
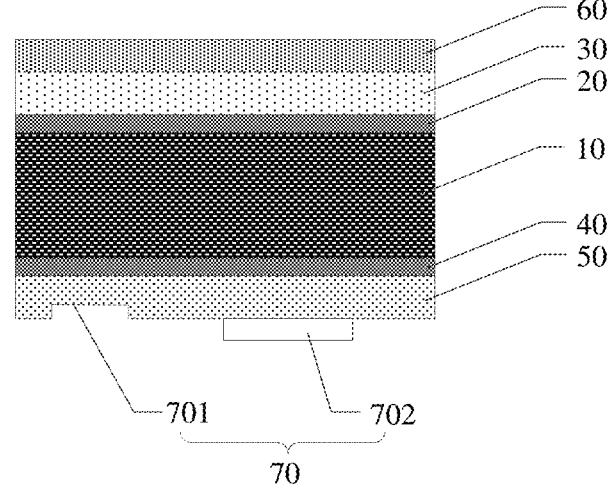
FIG. 1 is a schematic diagram of a structure of a housing according to an embodiment of this application.

10: Magnesium-based metal matrix; 10a: First side face; 10b: Second side face; 20: First transition layer; 30: First aluminum-based metal layer; 40: Second transition layer; 50: Second aluminum-based metal layer; 60: Appearance layer; 70: Electrical connection layer; 701: Fresh surface of a second aluminum-based metal layer 50; 701a: Partial surface; 701b: Partial surface; and 702: Conductive layer.

DETAILED DESCRIPTION OF ILLUSTRATIVE EMBODIMENTS

To explain the embodiments and advantages of this application clearly, the following further describes this application in detail with reference to the accompanying drawings.

Terms used in the following embodiments are merely intended to describe particular embodiments, but are not intended to limit this application. As used in the specification and appended claims of the application, singular expressions "one", "a", "the", "the foregoing", "this", and "the one" are also intended to include expressions such as "one or more", unless the contrary is clearly indicated in the context.

Reference to "an embodiment", "some embodiments", or the like described in this specification indicates that one or more embodiments of this application include a specific feature, structure, or characteristic described with reference to the embodiments. Therefore, statements such as "in an embodiment", "in some embodiments", "in some other embodiments", and "in other embodiments" that appear at different places in this specification do not necessarily mean reference to a same embodiment, instead, they mean "one or more but not all of embodiments", unless otherwise specifically emphasized. The terms "include", "comprise", "have", and their variants all mean "include but are not limited to", unless otherwise specifically emphasized.

A magnesium alloy may be used for a housing of an existing terminal device, for example, a rear cover of a mobile phone, a rear cover of a computer, or a middle frame of a mobile phone, to reduce a weight. The following lists parameters such as a dimension, a thickness, a weight, and an appearance of several typical thin and light laptops with magnesium alloy notebook computer housings. Refer to Table 1.

TABLE 1

PARAMETERS OF TYPICAL THIN AND LIGHT
LAPTOPS IN NOTEBOOK COMPUTERS WITH
MAGNESIUM ALLOY HOUSINGS

| Brand | Product | Dimension/ inch | Thickness/ mm | Weight/ g | Appearance |
|-------|---------|-----------------|---------------|-----------|------------|
| Huawei | Matebook X | 13 | 13.6 | 1000 | Paint spraying |
| NEC | LaVie Z | 13 | 14.9 | 875 | Paint spraying |
| Acer | Swift 5 | 14 | 14.9 | 970 | Paint spraying |
| LG | LG Gram 14Z950 | 14 | 13.4 | 980 | Paint spraying |

Based on parameters of terminal products listed in Table 1, a weight of a light and thin laptop with a magnesium alloy housing is light, and surface processing performed on the magnesium alloy housing is basically paint spraying.

The magnesium alloy housing is obviously worse than an existing commonly used aluminum alloy housing in terms of an appearance texture, wear resistance, reliability, an electrical connection, strength, rigidity, and the like. To improve decorativeness of the magnesium alloy, a surface of the magnesium alloy is covered with a layer of aluminum alloy, to manufacture a magnesium/aluminum laminated composite plate. However, a brittle phase is easily formed between two metals of magnesium and aluminum. Subsequently, a disadvantage such as layering easily occurs during molding of the housing. In a two-layer magnesium-aluminum composite structure, an internal stress and deformation are easily caused because magnesium and aluminum have different shrinkage ratios. In addition, the magnesium alloy exposed on a single side easily galvanically corrodes with the aluminum alloy, and reliability of the electrical connection is poor. Consequently, a housing of a magnesium/aluminum-based laminated composite material cannot have a light weight, a good look, high wear resistance, high reliability, high strength, high rigidity, good corrosion resistance, and good electrical connectivity.

To resolve the foregoing technical problem, an embodiment of this application provides a housing. For example, the housing may be used as a housing, a rear cover, or the like of a terminal device, and includes but is not limited to a rear cover of a mobile phone, a notebook computer housing, or a tablet computer housing.

FIG. 1 is a schematic diagram of a structure of a housing according to an embodiment of this application. As shown in FIG. 1, the housing includes a magnesium-based metal matrix 10, a first transition layer 20, a first aluminum-based metal layer 30, a second transition layer 40, and a second aluminum-based metal layer 50. The magnesium-based metal matrix 10 may be used to reduce a weight of the housing.

Figure 2:
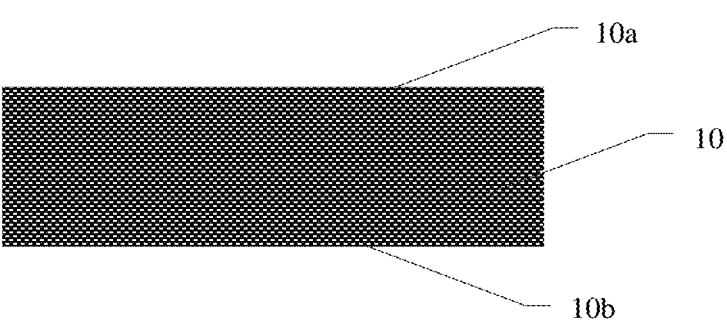
FIG. 2 is a schematic diagram of a structure of a magnesium-based metal matrix according to an embodiment of this application.

FIG. 2 is a schematic diagram of a structure of a magnesium-based metal matrix 10 according to an embodiment of this application. As shown in FIG. 2, in an embodiment of this application, the magnesium-based metal matrix 10 is divided into a first side face 10a and a second side face 10b. It should be noted that, after the terminal device is assembled by using the housing, based on an assembly location of the housing in the terminal device, the first side face 10a of the magnesium-based metal matrix 10 faces an appearance face of the terminal device, and the second side face 10b of the magnesium-based metal matrix 10 faces an inside of the terminal device. The appearance face of the terminal device is a surface that is directly observed by a user from an outside of the terminal device.

Still refer to FIG. 1 and FIG. 2. The first side face 10a of the magnesium-based metal matrix 10 is covered with a first transition layer 20, and a side that is of the first transition layer 20 and that is away from the magnesium-based metal matrix 10 is covered with a first aluminum-based metal layer 30. The first aluminum-based metal layer 30 is on an opposite side of an electronic component, is in contact with an external environment, is the appearance face of the terminal device, and provides a decoration for a product. The second side face 10b of the magnesium-based metal matrix 10 is covered with a second transition layer 40, a side that is of the second transition layer 40 and that is away from the magnesium-based metal matrix 10 is covered with a second aluminum-based metal layer 50, and the second aluminum-based metal layer 50 is close to a surface of the electronic component, and mainly fastens and supports the terminal device and provides an electrical connection point for the terminal device. Both shear and peel strength between the first transition layer 20 and the magnesium-based metal matrix 10 and shear and peel strength between the first transition layer 20 and the first aluminum-based metal layer 30 are greater than first shear and peel strength. Compared with an aluminum-magnesium composite material in which two metals of a magnesium-based metal and an aluminum-based metal are directly bonded in the conventional technology, in a solution of this application, the first transition layer 20 may be used to increase an interface bonding force between the magnesium-based metal matrix 10 and the first aluminum-based metal layer 30. Both shear and peel strength between the second transition layer 40 and the magnesium-based metal matrix 10 and shear and peel strength between the second transition layer 40 and the second aluminum-based metal layer 50 are greater than the first shear and peel strength. Compared with the aluminum-magnesium composite material in which the two metals of the magnesium-based metal and the aluminum-based metal are directly bonded in the conventional technology, in the solution of this application, the second transition layer 40 may be used to increase an interface bonding force between the magnesium-based metal matrix 10 and the second aluminum-based metal layer 50, to improve shear and peel strength of a magnesium-aluminum composite structure. In this way, the housing is not easily deformed. The first aluminum-based metal layer 30 and the second aluminum-based metal layer 50 may provide high wear resistance, high reliability, high strength, high rigidity, and good corrosion resistance for the housing.

Still refer to FIG. 1. In addition to the magnesium-based metal matrix 10, the first transition layer 20, the first aluminum-based metal layer 30, the second transition layer 40, and the second aluminum-based metal layer 50, the housing in this embodiment of this application may further include an appearance layer 60. The first aluminum-based metal layer 30 may further provide an aluminum matrix for the appearance layer 60, the appearance layer 60 may cover a surface of a side that is of the first aluminum-based metal layer 30 and that is away from the first transition layer 20, and the appearance layer 60 may provide a good look for the housing.

In an embodiment of this application, the appearance layer 60 may be an electrophoresis layer or an ink-jet printing layer, and the electrophoresis layer or the ink-jet printing layer may be used to improve a look of the housing. In addition, in an embodiment of this application, a thickness of an appearance layer 60 formed by using an ink-jet printing or electrophoresis process may be between 10 μm and 60 μm.

In another embodiment of this application, the appearance layer 60 is an anodic oxidation layer. In addition, in an embodiment of this application, a thickness of an appearance layer formed through anodic oxidation may be between 5 μm and 16 μm.

In an example, the housing is a cover of a notebook computer shown in FIG. 3. An appearance face of the cover shown in (A) in FIG. 3 has an anodic oxidation layer, and may not only have a metal texture, but also have a plurality of colors. For example, the appearance face is pink. A specific color of the appearance face is not limited in this application. A logo, for example, H, may be further designed for the appearance face. A style, a shape, and a size of the logo are not limited in this application. (B) in FIG. 3 shows a side of the cover. (C) in FIG. 3 shows a surface of an inner side of the cover, that is, a side that is of the second aluminum-based metal layer 50 and that is away from the magnesium-based metal matrix 10.

The anodic oxidation layer may meet a requirement of the housing for a good look, and may further be used as a corrosion resistance layer. When the anodic oxidation layer is used as a housing of the terminal device, the anodic oxidation layer may prevent corrosion of external moisture, to protect the magnesium-based metal matrix 10 and the first aluminum-based metal layer 30, and improve corrosion resistance of the housing.

Further, the housing may further include an electrical connection layer 70. The second aluminum-based metal layer 50 may provide an aluminum matrix for the electrical connection layer 70. The electrical connection layer 70 is disposed on a surface of a side that is of the second aluminum-based metal layer 50 and that is away from the second transition layer 40. For example, as shown in FIG. 1, the electrical connection layer 70 may include a fresh surface 701 of the second aluminum-based metal layer 50 and/or a conductive layer 702 that covers the surface of the second aluminum-based metal layer 50. The electrical connection layer 70 may provide good electrical connectivity for the housing.

In an embodiment of this application, a material of the electrical connection layer 70 is at least one of a partial fresh surface of the first aluminum-based metal layer 30, a copper sheet, or electrically conductive foam. When a partial surface of the first aluminum-based metal layer 30 is used as the electrical connection layer 70, for example, a partial surface of the inner side (that is, the side that is of the second aluminum-based metal layer 50 and that is away from the second transition layer 40) of the cover shown in (C) in FIG. 3 is processed by using a CNC process or a laser engraving process, to form a partial surface 701a and a partial surface 701b. When the material of the electrical connection layer 70 is selected from a copper sheet or electrically conductive foam, a partial surface of the side that is of the second aluminum-based metal layer 50 and that is away from the second transition layer 40 is processed by using a copper sheet spot welding process or is attached with electrically conductive foam, to form the conductive layer 702. The conductive layer 702 may meet a requirement of the housing for higher electrical connectivity. In addition, in an embodiment of this application, a thickness of the electrical connection layer 70 may range from 0.05 mm to 3 mm. For example, a thickness of a spot-welded copper sheet is usually less than or equal to 1 mm. For example, the thickness of the spot-welded copper sheet usually ranges from 0.05 mm to 0.08 mm. A thickness of the attached electrically conductive foam is large, and ranges from 0.08 mm to 3 mm.

One layer is usually removed from the surface of the second aluminum-based metal layer 50 by using the CNC process or the laser engraving process. A thickness of one layer removed by using the CNC process ranges from 0.1 mm to 1 mm, and a thickness of one layer removed by using the laser engraving process is approximately 0.05 mm.

In a specific implementation, if a requirement for conductivity of the electrical connection layer 70 is low, for example, the electrical connection layer 70 is used for grounding, the partial surface of the first aluminum-based metal layer 30 may be selected as the material of the electrical connection layer 70. If a requirement for conductivity of the electrical connection layer 70 is high, the copper sheet or the electrically conductive foam may be selected as the material of the electrical connection layer 70.

In an embodiment of this application, the magnesium-based metal matrix 10 provides a light magnesium-based material for the housing, and may be used to reduce a weight of the housing. When a material of the magnesium-based metal matrix 10 is selected, a wrought magnesium alloy that may be processed under pressure may be selected, including but being not limited to at least one of a magnesium-aluminum alloy, a magnesium-zinc alloy, or a magnesium-lithium alloy.

In an example description, a model of the magnesium-aluminum alloy may be, for example, AZ31B, AZ61, AZ80, or AZ91D, and a model of the magnesium-zinc magnesium alloy may be, for example, ZM21.

In an embodiment of this application, for example, a thickness of the housing is T. A thickness T4 of the magnesium-based metal matrix 10 is greater than 0.25 T and less than or equal to 0.95 T, and T is a positive number. When a proportion of the thickness of the magnesium-based metal matrix 10 to the housing ranges from 0.25 to 0.95, weight reduction, strength, and costs may be balanced, so that the housing meets different scenario requirements.

In an embodiment of this application, the first aluminum-based metal layer 30 provides an aluminum matrix for the appearance layer 60. When a material of the first aluminum-based metal layer 30 is selected, an aluminum-containing metal on which anodic oxidation may be performed may be selected, including but being not limited to at least one of a 1-series aluminum alloy to a 7-series aluminum alloy.

Optionally, the material of the first aluminum-based metal layer 30 is selected from at least one of a 5-series aluminum alloy or a 6-series aluminum alloy. In an example description, a model of the 5-series aluminum alloy may be 5252, 5052, or the like, and a model of the 6-series aluminum alloy may be 6013.

In an embodiment of this application, the second aluminum-based metal layer 50 provides the aluminum matrix for the electrical connection layer 70, to avoid galvanic corrosion caused by an electrical connection directly performed on the magnesium-based metal matrix. When a material of the second aluminum-based metal layer 50 is selected, an aluminum-containing metal that may be plastically processed and deformed may be selected, including but being not limited to at least one of a 1-series aluminum alloy to an 8-series aluminum alloy. Optionally, the material of the second aluminum-based metal layer 50 is selected from at least one of a 5-series aluminum alloy or a 6-series aluminum alloy.

In an embodiment of this application, for example, the thickness of the housing is T. A sum of a thickness T2 of the first aluminum-based metal layer 30 and a thickness T6 of the second aluminum-based metal layer 50 is greater than or equal to 0.05 T and less than or equal to 0.75 T. When a proportion of the sum of the thickness of the first aluminum-based metal layer 30 and the thickness of the second aluminum-based metal layer 50 to the thickness of the housing is 0.05 to 0.75, overall strength of the housing can be improved while a requirement for a light weight is met.

In an embodiment of this application, the thickness T2 of the first aluminum-based metal layer 30 is greater than or equal to the thickness T6 of the second aluminum-based metal layer 50. The thickness T2 of the first aluminum-based metal layer 30 is larger, and an aluminum matrix with a larger thickness may be provided for manufacturing the appearance layer 60, to meet various manufacturing requirements of a good-look appearance. For example, a high gloss chamfer may be manufactured at the first aluminum-based metal layer 30.

It should be understood that, in some other embodiments of this application, the thickness T2 of the first aluminum-based metal layer 30 may alternatively be less than the thickness T6 of the second aluminum-based metal layer 50.

In an embodiment of this application, when a material of the first transition layer 20 is selected, a material that can increase an interface bonding force of the magnesium-aluminum composite structure may be selected, including but being not limited to at least one of pure copper, a copper alloy, pure titanium, a titanium alloy, pure nickel, a nickel alloy, pure cobalt, a cobalt alloy, pure tantalum, a tantalum alloy, pure zinc, a zinc alloy, pure silver, or a silver alloy. In an example description, a model of the copper alloy may be, for example, T1, T2, TP1, TP2, TU1, or TU2, a model of the titanium alloy may be, for example, TA1 or TA2, a model of the nickel alloy may be, for example, N2, N4, N5, N6, N7, or N8, a model of the cobalt alloy may be, for example, L-605 or HA-188, a model of the tantalum alloy may be, for example, Ta10W, Ta2.5W, or Ta-40Nb, a model of the zinc alloy may be, for example, ZZnAl4Cu1Mg and ZZnAl4Cu3, and a model of the silver alloy may be, for example, AgCe0.5, AgCu5, or AgCu4NiRe.

Because the first transition layer 20 exists between the first aluminum-based metal layer 30 and the magnesium-based metal matrix 10 in the housing, for example, shear and peel strength of a laminated composite structure obtained after the aluminum alloy and the magnesium alloy are directly compounded usually does not exceed 20 MPa. In this embodiment of this application, shear and peel strength obtained after the first aluminum-based metal layer 30, the first transition layer 20, and the magnesium-based metal matrix 10 are compounded is greater than or equal to 30 MPa. In this way, shear and peel strength of the housing can be improved. In an embodiment of this application, a thickness T3 of the first transition layer 20 is greater than 0 and less than or equal to 0.2 T.

In an embodiment of this application, when a material of the second transition layer 40 is selected, a material that can increase a bonding force of the magnesium-aluminum composite structure may be selected, including but being not limited to at least one of pure copper, a copper alloy, pure titanium, a titanium alloy, pure nickel, a nickel alloy, pure cobalt, a cobalt alloy, pure tantalum, a tantalum alloy, pure zinc, a zinc alloy, pure silver, or a silver alloy.

In an example description, a model of the copper alloy may be, for example, T1, T2, TP1, TP2, TU1, or TU2, a model of the titanium alloy may be, for example, TA1 or TA2, a model of the nickel alloy may be, for example, N2, N4, N5, N6, N7, or N8, a model of the cobalt alloy may be, for example, L-605 or HA-188, a model of the tantalum alloy may be, for example, Ta10W, Ta2.5W, or Ta-40Nb, a model of the zinc alloy may be, for example, ZZnAl4Cu1Mg and ZZnAl4Cu3, and a model of the silver alloy may be, for example, AgCe0.5, AgCu5, or AgCu4NiRe.

Because the second transition layer 40 exists between the second aluminum-based metal layer 50 and the magnesium-based metal matrix 10 in the housing, shear and peel strength of the housing can be improved. For example, shear and peel strength obtained after the second aluminum-based metal layer 50, the second transition layer 40, and the magnesium-based metal matrix 10 are compounded is greater than or equal to 30 MPa. In an embodiment of this application, a thickness T5 of the second transition layer 40 is greater than 0 and less than or equal to 0.2 T.

In an embodiment of this application, different materials or a same material may be selected as the material of the first transition layer 20 and the material of the second transition layer 40. Compared with a case in which different materials are used for the first transition layer 20 and the second transition layer 40, in this implementation in which a same material is used for the first transition layer and the second transition layer, a process can be simplified.

Therefore, in the housing of this application, the magnesium-based metal matrix 10 may be used to reduce a weight of the housing. The first transition layer 20 covers the first side face of the magnesium-based metal matrix 10, the side that is of the first transition layer 20 and that is away from the magnesium-based metal matrix 10 is covered with the first aluminum-based metal layer 30, and both the shear and peel strength between the first transition layer 20 and the magnesium-based metal matrix 10 and the shear and peel strength between the first transition layer 20 and the first aluminum-based metal layer 30 are greater than the first shear and peel strength. Compared with the aluminum-magnesium composite material in which the two metals of the magnesium-based metal and the aluminum-based metal are directly bonded in the conventional technology, in the solution of this application, the first transition layer may be used to increase the interface bonding force between the magnesium-based metal matrix 10 and the first aluminum-based metal layer 30. In this way, the housing is not easily deformed. The second side face of the magnesium-based metal matrix 10 is covered with the second transition layer 40, the side that is of the second transition layer 40 and that is away from the magnesium-based metal matrix 10 is covered with the second aluminum-based metal layer 50, and both the shear and peel strength between the second transition layer 40 and the magnesium-based metal matrix 10 and the shear and peel strength between the second transition layer 40 and the second aluminum-based metal layer 50 are greater than the first shear and peel strength. Compared with the aluminum-magnesium composite material in which the two metals of the magnesium-based metal and the aluminum-based metal are directly bonded in the conventional technology, in the solution of this application, the second transition layer 40 may be used to increase the interface bonding force existing after the magnesium-based metal matrix 10 and the second aluminum-based metal layer 50 are compounded. In this way, the housing is not easily deformed. The first aluminum-based metal layer 30 and the second aluminum-based metal layer 50 may provide high wear resistance, high reliability, high strength, high rigidity, and good corrosion resistance for the housing. In addition, the first aluminum-based metal layer 30 may provide an aluminum matrix for the appearance layer 60, the appearance layer 60 may provide a good look for the housing, the second aluminum-based metal layer 50 may provide an aluminum matrix for the electrical connection layer 70, and the electrical connection layer 70 may provide good electrical connectivity for the housing. Therefore, the housing in this application can have a light weight, a good look, high wear resistance, high reliability, high strength, high rigidity, good corrosion resistance, and good electrical connectivity.

Based on a same technical concept, an embodiment of this application further provides a housing manufacturing method. As shown in FIG. 4, the manufacturing method includes the following steps.

S11: Perform molding processing on a laminated composite plate, to form a molded composite plate. The laminated composite plate includes a magnesium-based metal matrix, a first transition layer is disposed on a first side face of the magnesium-based metal matrix, a first aluminum-based metal layer is disposed on a side that is of the first transition layer and that is away from the magnesium-based metal matrix, a second transition layer is disposed on a second side face of the magnesium-based metal matrix, and a second aluminum-based metal layer is disposed on a side that is of the second transition layer and that is away from the magnesium-based metal matrix.

Both shear and peel strength between the first transition layer and the magnesium-based metal matrix and shear and peel strength between the first transition layer and the first aluminum-based metal layer are greater than first shear and peel strength, the first shear and peel strength is shear and peel strength between two metals of a magnesium-based metal and an aluminum-based metal in an aluminum-magnesium composite material, and both shear and peel strength between the second transition layer and the magnesium-based metal matrix and shear and peel strength between the second transition layer and the second aluminum-based metal layer are greater than the first shear and peel strength.

In an example description, molding processing in S11 may include but is not limited to at least one of thin plate stamping molding, thick plate forging and CNC molding, and thick plate full CNC molding.

S12: Perform surface processing on the molded composite plate, to form an appearance layer on a surface of the first aluminum-based metal layer.

In a possible implementation, surface processing is performed on a side of the first aluminum-based metal layer of the molded composite plate, to form an appearance layer on a surface of the first aluminum-based metal layer.

In an embodiment of this application, anodic oxidation processing is performed on a side of the molded composite plate, to form an anodic oxidation layer on the surface of the first aluminum-based metal layer. Through anodic oxidation processing, an appearance of the housing can meet a requirement for a good look, and corrosion resistance of the housing can be further improved.

In another embodiment of this application, electrophoresis processing or ink-jet printing processing is performed on the molded composite plate, to form the appearance layer on the surface of the first aluminum-based metal layer.

S13: Process a side of the second aluminum-based metal layer of the molded composite plate, to form an electrical connection layer on a surface of the second aluminum-based metal layer.

In an embodiment of this application, at least one of a CNC process, a laser engraving process, a copper sheet spot welding process, or electrically conductive foam attaching is performed on the molded composite plate, to form the electrical connection layer on the surface of the second aluminum-based metal layer. The partial computer numerical control (CNC) machining or laser engraving surface of the first aluminum-based metal layer is used as the electrical connection layer, to meet a requirement of the housing for electrical connectivity. A spot-welded copper sheet of the first aluminum-based metal layer is used as the electrical connection layer, to meet the requirement of the housing for higher electrical connectivity.

In an embodiment of this application, the laminated composite plate may be manufactured in the following method: The first aluminum-based metal layer, the first transition layer, the magnesium-based metal matrix, the second transition layer, and the second aluminum-based metal layer that are sequentially stacked may be compounded in a laminar form by using at least one of a rolling process, a forging process, an extrusion process, and a diffusion welding process, to form the laminated composite plate.

In an embodiment of this application, as shown in FIG. 5, a laminated composite plate manufacturing process is as follows:

S11: Form the first transition layer on a surface of a side of the first aluminum-based metal layer and/or a first side face of the magnesium-based metal matrix through at least one of chemical plating, electroplating, thermal spraying, ion plating, and diffusion welding.

For example, before S11, processing, for example, surface sanding processing may be first performed on the first aluminum-based metal layer, the magnesium-based metal matrix, and a transition metal sheet, to remove a surface oxide layer, and air-drying is performed after ultrasonic cleaning.

S111 may be implemented in any one of the following manners:

Manner A1: Form the first transition layer on the surface of the side of the first aluminum-based metal layer through at least one of chemical plating, electroplating, thermal spraying, ion plating, and diffusion welding.

For example, if a thickness of a first transition layer in a housing that needs to be manufactured is T3, the first transition layer whose thickness is T3 may be formed on the surface of the side of the first aluminum-based metal layer.

Manner A2: Form the first transition layer on the first side face of the magnesium-based metal matrix through at least one of chemical plating, electroplating, thermal spraying, ion plating, and diffusion welding.

For example, if a thickness of a first transition layer in a housing that needs to be manufactured is T3, the first transition layer whose thickness is T3 may be formed on the first side face of the magnesium-based metal matrix.

Manner A3: Form the first transition layer on a surface of a side of the first aluminum-based metal layer and a first side face of the magnesium-based metal matrix through at least one of chemical plating, electroplating, thermal spraying, ion plating, and diffusion welding.

For example, if a thickness of a first transition layer in a housing that needs to be manufactured is T3, a first transition layer whose thickness is x1 may be formed on a surface of a side of the first aluminum-based metal layer, and a first transition layer whose thickness is y1 may be formed on the first side face of the magnesium-based metal matrix. A sum of x1 and y1 is equal to T3. Both x1 and y1 are positive numbers. A value relationship between x1 and y1 is not limited in this application, x1 may be greater than y1, or may be equal to y1, or may be less than y1.

S112: Form the second transition layer on a surface of a side of the second aluminum-based metal layer and/or a second side face of the magnesium-based metal matrix through at least one of chemical plating, electroplating, thermal spraying, ion plating, and diffusion welding.

S112 may be implemented in any one of the following manners:

Manner B1: Form the second transition layer on the surface of the side of the second aluminum-based metal layer through at least one of chemical plating, electroplating, thermal spraying, ion plating, and diffusion welding.

For example, if a thickness of a second transition layer in a housing that needs to be manufactured is T5, the second transition layer whose thickness is T5 may be formed on the surface of the side of the second aluminum-based metal layer.

Manner B2: Form the second transition layer on the second side face of the magnesium-based metal matrix through at least one of chemical plating, electroplating, thermal spraying, ion plating, and diffusion welding.

For example, if a thickness of a second transition layer in a housing that needs to be manufactured is T5, the second transition layer whose thickness is T5 may be formed on the second side face of the magnesium-based metal matrix.

Manner B3: Form the second transition layer on a surface of a side of the second aluminum-based metal layer and a second side face of the magnesium-based metal matrix through at least one of chemical plating, electroplating, thermal spraying, ion plating, and diffusion welding.

For example, if a thickness of a second transition layer in a housing that needs to be manufactured is T5, a second transition layer whose thickness is x2 may be formed on a surface of a side of the second aluminum-based metal layer, and a second transition layer whose thickness is y2 may be formed on a second side face of the magnesium-based metal matrix. A sum of x2 and y2 is equal to T5. Both x2 and y2 are positive numbers. A value relationship between x2 and y2 is not limited in this application, x2 may be greater than y2, or may be equal to y2, or may be less than y2.

S113: Stack the first aluminum-based metal layer, the magnesium-based metal matrix, and the second aluminum-based metal layer, to form the first aluminum-based metal layer, the first transition layer, the magnesium-based metal matrix, the second transition layer, and the second aluminum-based metal layer that are sequentially stacked.

When the first aluminum-based metal layer and the magnesium-based metal matrix are stacked, the first transition layer formed in any one of Manner A1, Manner A2, and Manner A3 may be stacked with the first aluminum-based metal layer and/or the magnesium-based metal matrix. Descriptions are separately provided below.

Figures 6, 7:
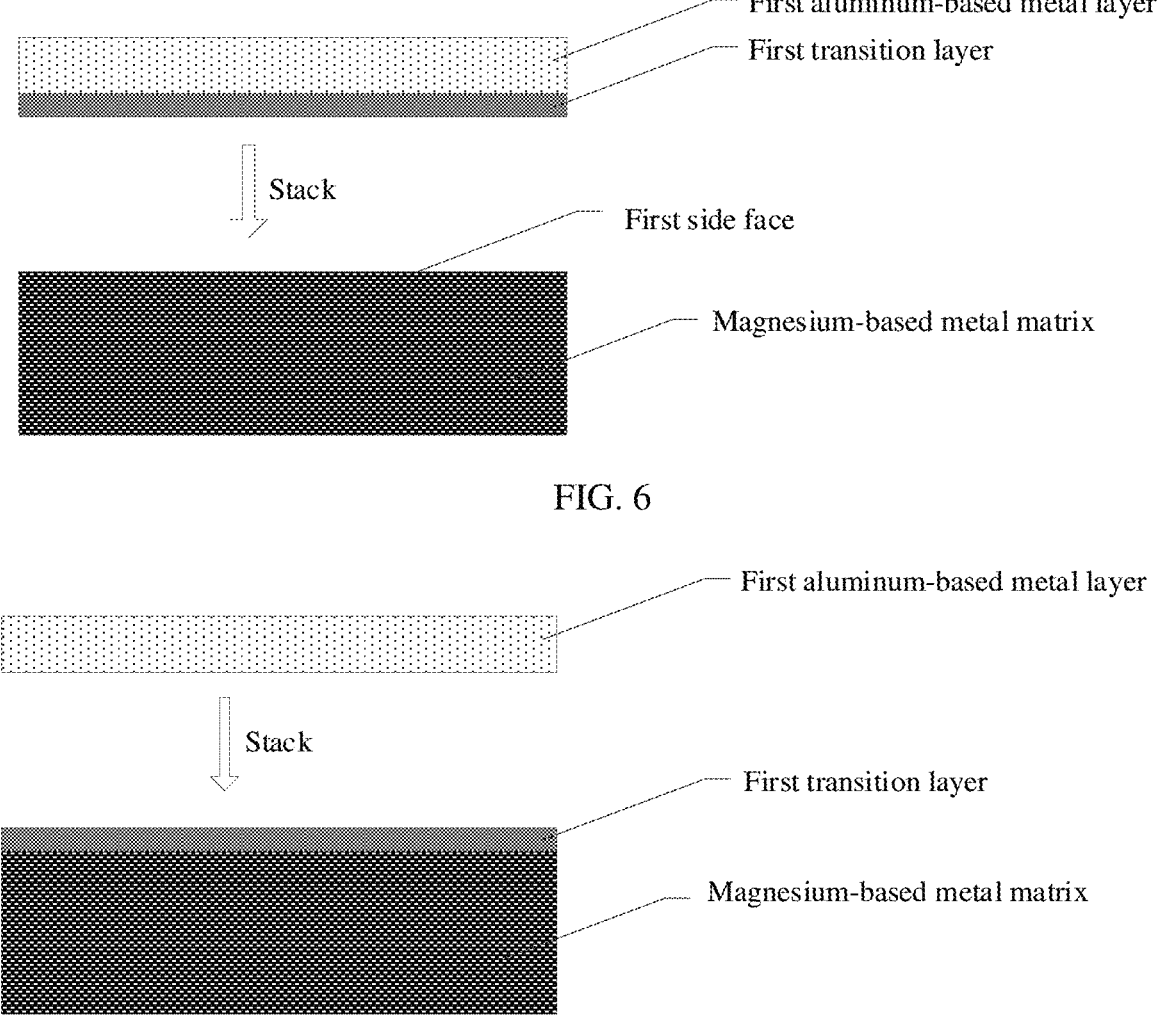
FIG. 6 is a flowchart of a first transition layer manufacturing process according to an embodiment of this application.
FIG. 7 is a flowchart of a first transition layer manufacturing process according to an embodiment of this application.

In an example, the first transition layer is formed in Manner A1. As shown in FIG. 6, the first transition layer is formed on the surface of the side of the first aluminum-based metal layer, and the side of the surface that is of the first aluminum-based metal layer and on which the first transition layer is formed is stacked on the first side face of the magnesium-based metal matrix.

In another example, the first transition layer is formed in Manner A2. As shown in FIG. 7, the first transition layer is formed on the first side face of the magnesium-based metal matrix, and the side of the surface that is the first aluminum-based metal layer and on which the first transition layer is formed is stacked on the first side face of the magnesium-based metal matrix.

Figures 8, 9:
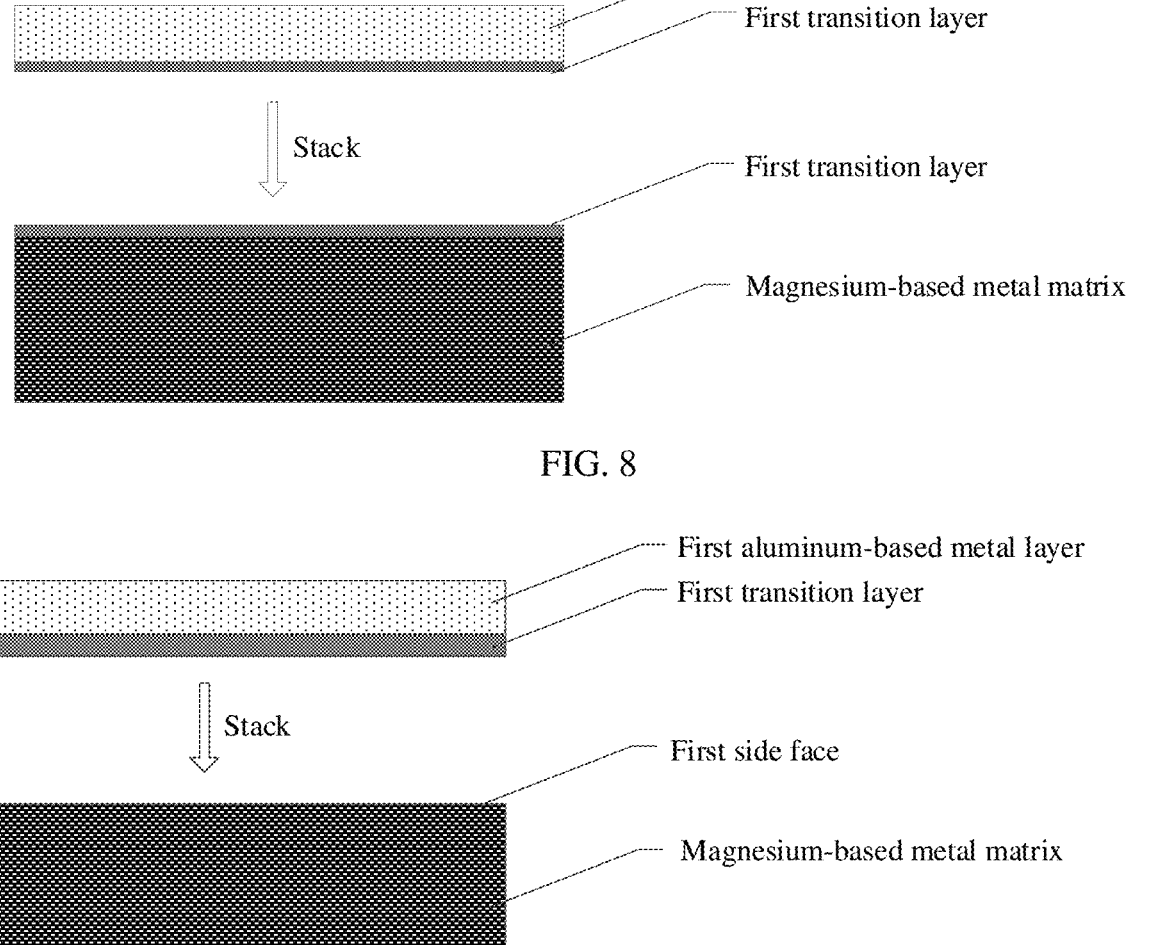
FIG. 8 is a flowchart of a first transition layer manufacturing process according to an embodiment of this application.
FIG. 9 is a flowchart of a laminated composite material stacking process according to an embodiment of this application.

In still another example, the first transition layer is formed in Manner A3. As shown in FIG. 8, a part of the first transition layer is formed on a surface of a side of the first aluminum-based metal layer, another part of the first transition layer is formed on the first side face of the magnesium-based metal matrix, and the side that is of the first aluminum-based metal layer and on which the part of the first transition layer is formed is stacked on the first side face that is of the magnesium-based metal matrix and on which the first transition layer is formed.

Based on a same concept, when the magnesium-based metal matrix and the second aluminum-based metal layer are stacked, the second transition layer formed in any one of Manner B1, Manner B2, and Manner B3 may be stacked with the first aluminum-based metal layer and/or the magnesium-based metal matrix. For a specific implementation, refer to related content of stacking the first aluminum-based metal layer and the magnesium-based metal matrix. Details are not described herein again.

An example in which the magnesium-based metal matrix and the first aluminum-based metal layer are stacked to form the first transition layer in Manner A1, and the magnesium-based metal matrix and the second aluminum-based metal layer are stacked to form the second transition layer in Manner B3 is used to describe a stacking process in S113.

As shown in FIG. 9, the first transition layer is formed on the surface of the side of the first aluminum-based metal layer, a part of the second transition layer is formed on the surface of the side of the second aluminum-based metal layer, another part of the second transition layer is formed on the second side face of the magnesium-based metal matrix, a side of the surface that is of the first aluminum-based metal layer and on which the first transition layer is formed is stacked on the first side face of the magnesium-based metal matrix, the first aluminum-based metal layer, the first transition layer, the magnesium-based metal matrix, and the magnesium-based metal matrix that are stacked are stacked on the second aluminum-based metal layer on which a part of the second transition layer is formed. To achieve a fastening effect, the first aluminum-based metal layer, the first transition layer, the magnesium-based metal matrix, the second transition layer, and the second aluminum-based metal layer that are sequentially stacked may be fastened through riveting.

At least one of chemical plating, electroplating, thermal spraying, ion plating, and diffusion welding is used, so that there can be high bonding strength between the first transition layer and the surface of the side of the first aluminum-based metal layer and/or the first side face of the magnesium-based metal matrix, and there can be high bonding strength between the second transition layer and the surface of the side of the second aluminum-based metal layer and/or the second side face of the magnesium-based metal matrix.

S114: Compound, in a laminar form by using at least one of a rolling process, a forging process, an extrusion process, and a diffusion welding process, the first aluminum-based metal layer, the first transition layer, the magnesium-based metal matrix, the second transition layer, and the second aluminum-based metal layer that are sequentially stacked, to form the laminated composite plate.

The following describes a housing manufacturing process in this application with reference to different embodiments.

Embodiment 1

In an embodiment of this application, as shown in FIG. 10, that a housing whose thickness is 0.8 mm is manufactured is used as an example. A housing manufacturing process is as follows:

S201: Pre-manufacture a transition layer 1 and a transition layer 2, where pure Cu foil may be selected as a material of the transition layer 1 and a material of the transition layer 2, and the Cu foil is cut into strips. In the following embodiment, copper may be understood as pure copper.

In an example description, the Cu foil is striped and cut to obtain Cu foil whose thickness is 0.04 mm and dimension is 0.04 mm*250 mm*300 mm. A dimension of the Cu foil is the same as that of a magnesium alloy layer (AZ31B), a plate shape is flat, and a surface is clean and free of contamination such as fat and dirt.

Figure 11:
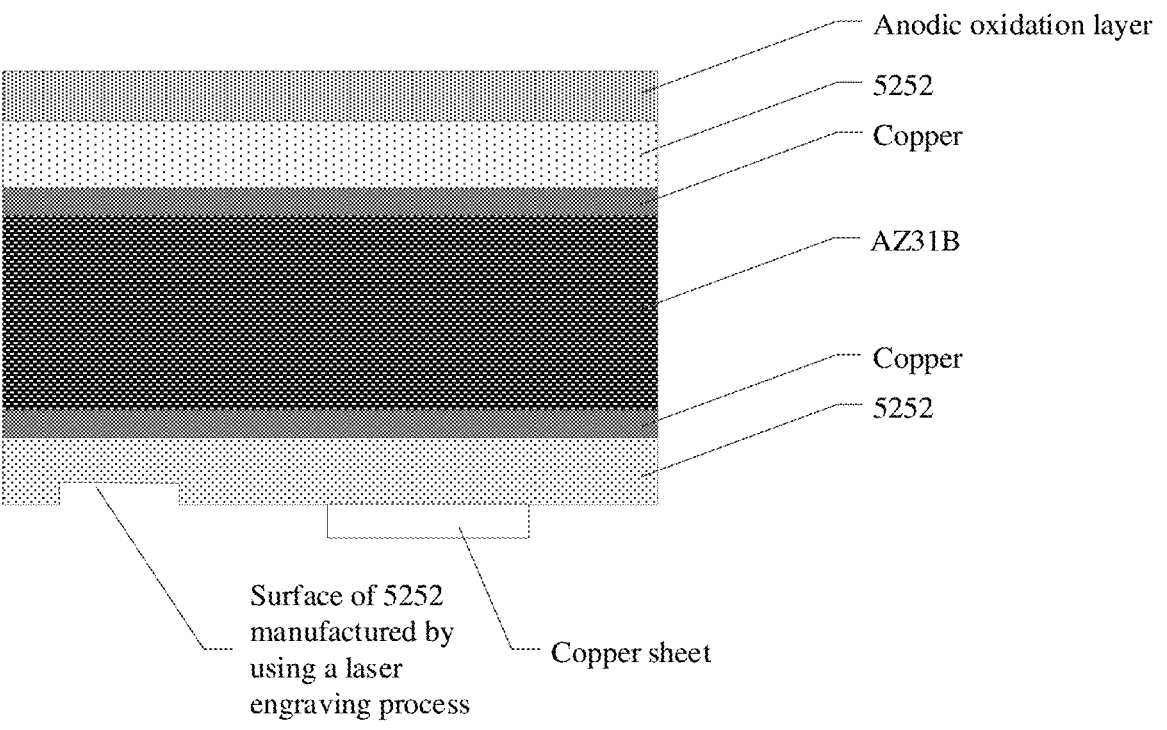
FIG. 11 is a schematic diagram of composite materials that are stacked in a laminar form according to an embodiment of this application.

S202: As shown in FIG. 11, sequentially stack an aluminum alloy layer 2 (5252), the transition layer 2 (copper foil), the magnesium alloy layer (AZ31B), the transition layer 1 (copper foil), and an aluminum alloy layer 1 (5252) in a laminar form.

In an example description, surface sanding processing is performed on a magnesium alloy sheet (Thickness: 1.2 mm, and Dimension: 1.2 mm*250 mm*300 mm), an aluminum alloy sheet (Thickness: 0.2 mm, and Dimension: 0.2 mm*250 mm*300 mm), and the Cu foil (Thickness: 0.04 mm, and Dimension: 0.04 mm*250 mm*300 mm), to remove a surface oxide layer, ultrasonic cleaning is performed, and then air-drying is performed.

The aluminum alloy layer 2, the transition layer 2, the magnesium alloy layer, the transition layer 1, and the aluminum alloy layer 1 are stacked neatly from bottom to top based on a laminated composite structure. An overall thickness obtained after stacking is 1.6 mm. Then, the laminated composite structure obtained after stacking is fastened through riveting.

S203: Compound, in a laminar form by using a rolling process, the aluminum alloy layer 2 (5252), the transition layer 2 (copper foil), the magnesium alloy layer (AZ31B), the transition layer 1 (copper foil), and the aluminum alloy layer 1 (5252) that are stacked in the laminar form, to form a laminated composite plate.

In an example description, the aluminum alloy layer 2 (5252), the transition layer 2 (copper foil), the magnesium alloy layer (AZ31B), the transition layer 1 (copper foil), and the aluminum alloy layer 1 (5252) that are stacked in a laminar form are heated for 90±10 min at a heating temperature of 380±10° C., and are hot rolled for a plurality of times to a target thickness of 0.8 mm, and a total deformation amount is 50%.

S204: Perform molding processing on the laminated composite plate, to form a molded composite plate.

In an example description, the laminated composite plate is cut and then stamped, and is formed into a shape of a PC housing.

S205: Perform surface processing on the molded composite plate, to form an anodic oxidation layer on a side that is of the aluminum alloy layer 1 (5252) and that is away from the transition layer 1.

It should be understood that, in S205, it only needs to be ensured that, when anodic oxidation processing is performed on the molded composite plate, the anodic oxidation layer is formed on the side that is of the aluminum alloy layer 1 (5252) and that is away from the transition layer 1. When anodic oxidation processing is performed on the molded composite plate, an anodic oxidation layer may also be formed on a side that is of the aluminum alloy layer 2 (5252) and that is away from the transition layer 2. Whether the anodic oxidation layer is formed on the side that is of the aluminum alloy layer 2 (5252) and that is away from the transition layer 2 does not affect a subsequent step. Even if the anodic oxidation layer is formed on the side that is of the aluminum alloy layer 2 (5252) and that is away from the transition layer 2, it only needs to be ensured that a surface of the anodic oxidation layer on the side that is of the aluminum alloy layer 2 (5252) and that is away from the transition layer 2 is processed in S206, to form an electrical connection layer.

S206: Process a side of the aluminum alloy layer 2 (5252) of the molded composite plate, to form the electrical connection layer on the side that is of the aluminum alloy layer 2 and that is away from the transition layer 2: a surface of 5252 manufactured by using a laser engraving process and a spot-welded copper sheet.

Figure 12:
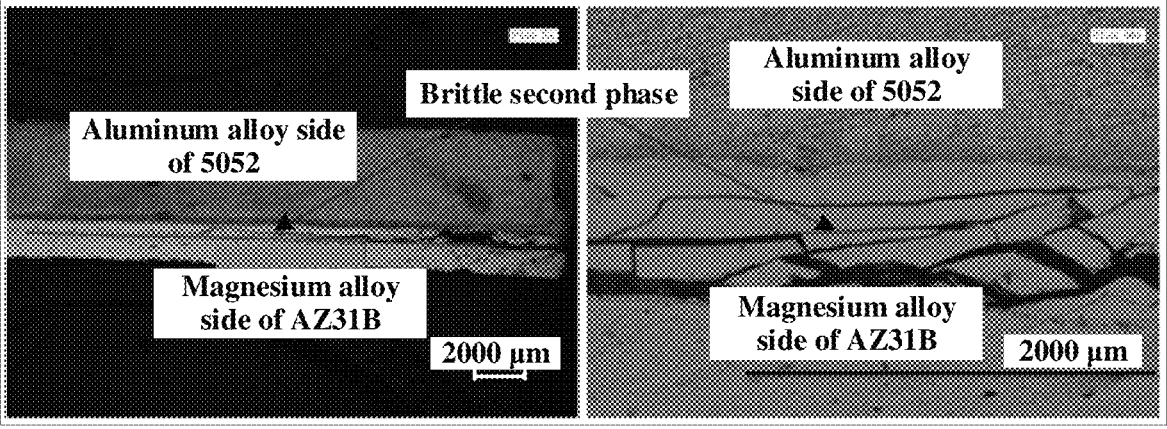
FIG. 12 is a schematic diagram of a magnesium aluminum layer without a transition layer in the conventional technology.
Figure 13A:
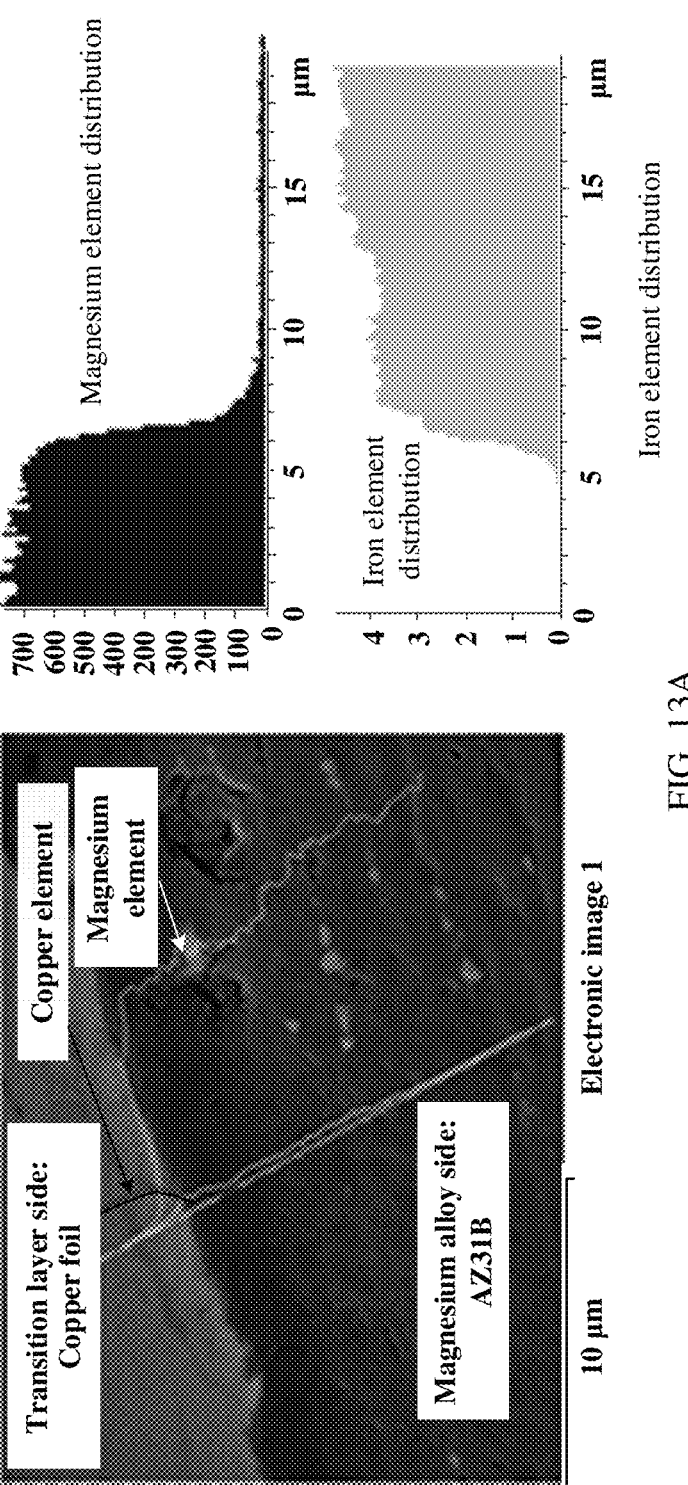
FIG. 13A is a schematic diagram of bonding copper and a magnesium-based metal matrix according to an embodiment of this application.
Figure 13B:
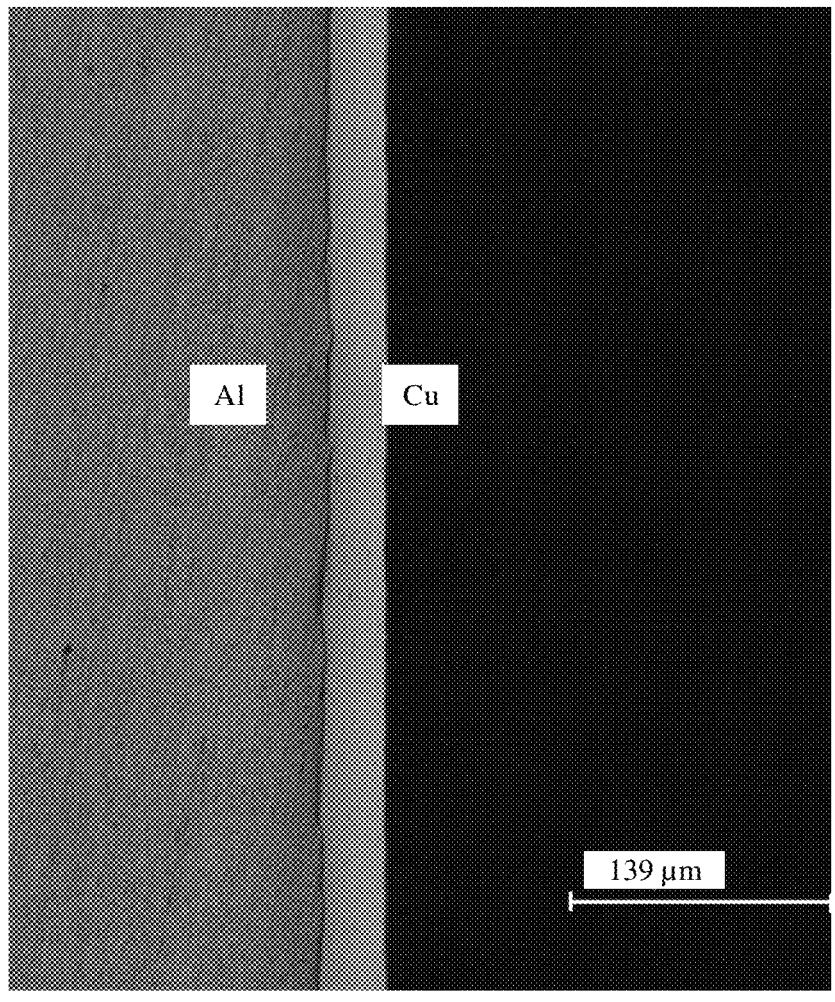
FIG. 13B is a schematic diagram of bonding copper and an aluminum-based metal layer according to an embodiment of this application.

Housing structure information of the housing obtained in the manufacturing method in this application is shown in Table 2. An overall thickness is approximately 0.8 mm, a comprehensive density is 2.3 g/cm³, the housing is of a seven-layer structure, a middle AZ31B magnesium alloy matrix whose thickness is 0.6 mm is used to reduce a weight, 5252 whose surface is 0.1 mm functions as an anodic oxidation substrate, and 5252 whose bottom layer has a thickness of 0.1 mm provides a substrate for an electrical connection. An appearance decoration and electrical connection reliability are improved. In addition, aluminum alloys on upper and lower surfaces isolate the magnesium alloy from an outside, to improve corrosion resistance of a magnesium matrix. In the conventional technology, a large quantity of brittle second phases shown in FIG. 12 are generated between two metals of a magnesium layer and an aluminum layer without a transition layer. However, in the housing manufactured in Embodiment 1 of this application, copper is used as a middle transition layer between AZ31B and 5252, and no large quantity of brittle second phases are generated. As shown in FIG. 13A, no large quantity of second phases are generated between copper and the AZ31B magnesium alloy. As shown in FIG. 13B, no large quantity of second phases are generated between copper and the 5252 aluminum alloy, an interface bonding force existing after three phases of magnesium, copper, and aluminum are compounded is increased, and the shear strength is increased from 15 MPa to 40 MPa.

TABLE 2

| | Structure information of a metal housing | | | |
|---|---|---|---|---|
| Sequence number | Structural layer | Material | | Thickness |
| 1 | Appearance layer | Anodic oxidation | T1 | 12 μm |
| 2 | Aluminum alloy layer 1 | 5252 | T2 | 0.1 mm |
| 3 | Transition layer 1 | Copper foil | T3 | 0.02 mm |
| 4 | Magnesium alloy layer | AZ31B | T4 | 0.6 mm |
| 5 | Transition layer 2 | Copper foil | T5 | 0.02 mm |
| 6 | Aluminum alloy layer 2 | 5252 | T6 | 0.1 mm |
| 7 | Electrical connection layer | Spot-welded copper sheet and laser engraving | T7 | 0.05 mm |

Embodiment 2

In an embodiment of this application, as shown in FIG. 14, for example, a housing with a thickness of 6 mm is manufactured, and a magnesium-based metal matrix is a magnesium alloy AZ80. In the following embodiment, nickel may be understood as pure nickel. A housing manufacturing process is as follows:

S301: Pre-manufacture a transition layer 1 and a transition layer 2, where Nickel (Ni) may be selected as a material of the transition layer 1 and a material of the transition layer 2, and a 0.05 mm Ni layer is plated on two faces of a front face and a rear face of a magnesium alloy layer (AZ80) in an electroplating manner. Herein, the two faces of the front face and the rear face are a first side face and a second side face. If the front face is the first side face, the rear surface is the second side face; or if the rear surface is the first side face, the front surface is the second side face.

In an example description, a thickness of the magnesium alloy layer (AZ80) is 5 mm, a dimension is 5*230*280 mm³, a plate shape is flat, and a surface is clean and free of contamination such as fat and dirt.

Figure 15:
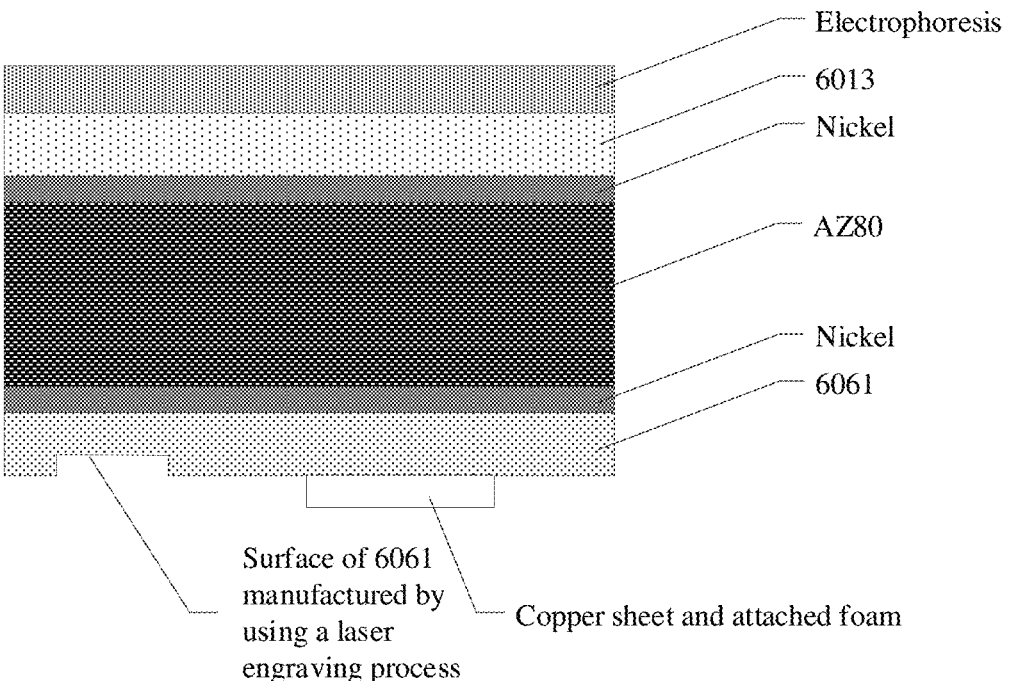
FIG. 15 is a schematic diagram of composite materials that are stacked in a laminar form according to an embodiment of this application.

S302: As shown in FIG. 15, sequentially stack an aluminum alloy layer 2 (6061), the transition layer 2 (Ni), the magnesium alloy layer (AZ80), the transition layer 1 (Ni), and an aluminum alloy layer 1 (6013) in a laminar form.

In an example description, surface sanding processing is performed on an aluminum alloy sheet (Thickness: 0.6 mm, and Dimension: 0.6*230*280 mm³), a magnesium alloy sheet (Thickness: 5 mm, and Dimension: 5*230*280 mm³), an aluminum alloy sheet (Thickness: 0.4 mm, and Dimension: 0.4*230*280 mm³), and a Ni sheet, to remove a surface oxide layer, ultrasonic cleaning is performed, and then air-drying is performed.

Based on a structure of a composite housing:

The aluminum alloy layer 2 (6061), the transition layer 2 (Ni), the magnesium alloy layer (AZ80), the transition layer 1 (Ni), and the aluminum alloy layer 1 (6013) are stacked neatly and tightly from bottom to top based on a laminated composite structure, and an overall thickness obtained after stacking is 6 mm. Then, the stacked laminated composite structure is fastened through riveting.

S303: Compound, in a laminar form by using a hot pressing molding process, the aluminum alloy layer 2 (6061), the transition layer 2 (Ni), the magnesium alloy layer (AZ80), the transition layer 1 (Ni), and the aluminum alloy layer 1 (6013) that are stacked in the laminar form, to form a laminated composite plate.

In an example description, the aluminum alloy layer 2 (6061), the transition layer 2 (Ni), the magnesium alloy layer (AZ80), the transition layer 1 (Ni), and the aluminum alloy layer 1 (6013) that are stacked in a laminar form are heated for 120±10 min at a heating temperature of 350±10° C., and are hot-pressing molded, a molding pressure is 100±10 MPa, and a hot pressing time period is 3±1 min.

S304: Perform CNC molding processing on the laminated composite plate, to form a molded composite plate.

In an example description, the laminated composite plate is cut and then stamped, and is formed into a PC housing.

S305: Perform electrophoresis on the molded composite plate, to form an electrophoresis layer on a side that is of the aluminum alloy layer 1 (6013) and that is away from a first transition layer.

Herein, similar to S205, in S305, it only needs to be ensured that electrophoresis is performed on the molded composite plate, to form the electrophoresis layer on the side that is of the aluminum alloy layer 1 (6013) and that is away from the first transition layer. However, when electrophoresis is performed on the molded composite plate, an electrophoresis layer may also be formed on a surface that is of the aluminum alloy layer 2 (6061) and that is away from the transition layer 2, and S306 is not affected. Even if the electrophoresis layer is formed on the surface that is of the aluminum alloy layer 2 (6061) and that is away from the transition layer 2, in S306, a surface of an electrophoresis layer on a side of the aluminum alloy layer 2 of the molded composite plate is processed, to form the electrical connection layer.

S306: Process a surface of a side of the aluminum alloy layer 2 of the molded composite plate, to form an electrical connection layer on a side that is of the aluminum alloy layer 2 and that is away from the second transition layer: a surface of 6061 manufactured by using a laser engraving process, a spot-welded copper sheet, and attached electrically conductive foam.

Housing structure information of the housing obtained in the manufacturing method in this application is shown in Table 3. An overall thickness is approximately 6 mm, a comprehensive density is 26 g/cm³, the housing is of a seven-layer structure, a middle magnesium alloy layer AZ80 whose thickness is 5 mm is used to reduce a weight, 6013 whose surface has a thickness of 0.6 mm functions as an electrophoresis substrate, and 6061 whose bottom layer has a thickness of 0.4 mm provides a substrate for an electrical connection. Ni is directly electroplated on two faces of the magnesium alloy matrix AZ80, and is used as a middle transition layer between AZ80 and the aluminum alloy (6013/6061). No large quantity of brittle second phases are generated. An interface bonding force existing after the magnesium alloy layer, the transition layer, and the aluminum-based metal layer are compounded is increased, and shear strength is increased from approximately 15 MPa to 50 MPa.

TABLE 3

| Sequence number | Structural layer | Material | | Thickness |
| --- | --- | --- | --- | --- |
| 1 | Appearance layer | Electrophoresis | T1 | 35 μm |
| 2 | Aluminum alloy layer 1 | 6013 | T2 | 0.6 mm |
| 3 | Transition layer 1 | Copper foil | T3 | 0.05 mm |
| 4 | Magnesium alloy layer | AZ80 | T4 | 5 mm |
| 5 | Transition layer 2 | Ni | T5 | 0.05 mm |
| 6 | Aluminum alloy layer 2 | 6061 | T6 | 0.4 mm |
| 7 | Electrical connection layer | Spot-welded copper sheet, laser engraving, and attached electrically conductive foam | T7 | 0.05 mm |

Structure information of a metal housing

Based on any one of the foregoing embodiments, a housing obtained in the manufacturing method in this application includes the magnesium-based metal matrix, the first transition layer, the first aluminum-based metal layer, the appearance layer, the second transition layer, the second aluminum-based metal layer, and the electrical connection layer. A result of comparing the housing and an existing aluminum alloy housing and an existing magnesium alloy housing is shown in Table 4.

TABLE 4

Result of comparing a housing obtained in a manufacturing method in this application and an existing housing

| Housing | Quantity of structural layers | Density g/cm³ | Surface processing | | | | Electrical connection Laser engraving, a copper sheet, and foam | Yield strength Yield strength, MPa | Elastic modulus Elastic modulus, GPa |
| | | | Appearance effect | Texture | Scratch resistance | Coating reliability | | | |
| --- | --- | --- | --- | --- | --- | --- | --- | --- | --- |
| Housing manufactured in this application | 7 | 1.8 to 2.7 | Same as an aluminum alloy | Same as an aluminum alloy | Same as an aluminum alloy | Same as an aluminum alloy | Same as an aluminum alloy | Between magnesium and aluminum | 45 to 70 |
| Existing aluminum alloy housing | 3 | 2.7 | Mainly anodic oxidation | Metal texture | Hardness: 5H to 6H, good | Good | Reliable and not easy to corrode | High | 70 |
| Existing magnesium alloy housing | 3 | 1.8 | Mainly paint spraying | Plastic texture | Hardness: 2H to 3H, poor | Poor | Unreliable and easy to corrode | Low | 45 |

The magnesium-based metal matrix may be used to reduce a weight of the housing. A first transition layer covers a first side face of the magnesium-based metal matrix, a side that is of the first transition layer and that is away from the magnesium-based metal matrix is covered with the first aluminum-based metal layer, and a bonding force between the first transition layer and the magnesium-based metal matrix, shear and peel strength between the first transition layer and the first aluminum-based metal layer, and the shear and peel strength between the first transition layer and the first aluminum-based metal layer are all greater than first shear and peel strength. Compared with an aluminum-magnesium composite material in which two metals of a magnesium-based metal and an aluminum-based metal are directly bonded in the conventional technology, in the solution of this application, the first transition layer may be used to increase a bonding force existing after the magnesium-based metal matrix and the first aluminum-based metal layer are compounded. In this way, the housing is not easily deformed. A second side face of the magnesium-based metal matrix is covered with a second transition layer, a side that is of the second transition layer and that is away from the magnesium-based metal matrix is covered with a second aluminum-based metal layer, both shear and peel strength between the second transition layer and the magnesium-based metal matrix and shear and peel strength between the second transition layer and the second aluminum-based metal layer are greater than first shear and peel strength. Compared with the aluminum-magnesium composite material in which the two metals of a magnesium-based metal and an aluminum-based metal are directly bonded in the conventional technology, in a solution of this application, the first transition layer may be used to increase an interface bonding force existing after the magnesium-based metal matrix and the second aluminum-based metal layer are compounded. In this way, the housing is not easily deformed. The first aluminum-based metal layer and the second aluminum-based metal layer may provide high wear resistance, high reliability, high strength, and high rigidity for the housing. In addition, the first aluminum-based metal layer may provide an aluminum matrix for the appearance layer, the appearance layer may provide a good look for the housing, the second aluminum-based metal layer may provide an aluminum matrix for the electrical connection layer, and the electrical connection layer may provide good electrical connectivity for the housing. Therefore, the housing in this application can have a light weight, a good look, high wear resistance, high reliability, high strength, high rigidity, good corrosion resistance, and good electrical connectivity.

Based on a same technical concept, an embodiment of this application further provides a terminal device. The terminal device may be, for example, a mobile phone, a notebook computer, a tablet computer, or a display. The terminal device includes the housing in the possible implementations in the foregoing embodiments or the housing obtained in the manufacturing method in the foregoing embodiments of this application.

The terminal device in this application includes the housing the possible implementations of this application. Therefore, when the housing has a light weight, a good look, high wear resistance, high reliability, high strength, high rigidity, good corrosion resistance, and good electrical connectivity, the terminal device in this application also has a light weight, a good look, high wear resistance, high reliability, high strength, high rigidity, good corrosion resistance, and good electrical connectivity.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims

What is claimed is:

1. A housing, comprising:
   a magnesium-based metal matrix;
   a first aluminum-based metal layer and a second aluminum-based metal layer are respectively disposed on two sides of the magnesium-based metal matrix;
   a first metal layer comprising copper, titanium, nickel, cobalt, tantalum, zinc, or silver, the first metal layer disposed between the magnesium-based metal matrix and the first aluminum-based metal layer;
   an anodic oxidation layer, an electrophoresis layer, or an ink-jet printing layer disposed on a surface of a side that is of the first aluminum-based metal layer and that is away from the first metal layer;
   a second metal layer comprising copper, titanium, nickel, cobalt, tantalum, zinc, or silver, the second metal layer disposed between the magnesium-based metal matrix and the second aluminum-based metal layer; and a conductive surface defining electrical connection pads disposed on a surface of a side that is of the second aluminum-based metal layer and that is away from the second metal layer.

2. The housing according to claim 1, wherein the layer disposed on the surface of the side that is of the first aluminum-based metal layer and that is away from the first metal layer comprises the ink-jet printing layer.

3. The housing according to claim 1, wherein a material of the magnesium-based metal matrix comprises a wrought magnesium alloy.

4. The housing according to claim 1, wherein a material of the first metal layer is selected from at least one of pure titanium, a titanium alloy, pure nickel, a nickel alloy, pure cobalt, a cobalt alloy, pure tantalum, a tantalum alloy, pure zinc, a zinc alloy, pure silver, or a silver alloy, and wherein a material of the second metal layer is selected from at least one of pure titanium, a titanium alloy, pure nickel, a nickel alloy, pure cobalt, a cobalt alloy, pure tantalum, a tantalum alloy, pure zinc, a zinc alloy, pure silver, or a silver alloy.

5. The housing according to claim 1, wherein a material of the first metal layer and a material of the second metal layer are a same material.

6. The housing according to claim 1, wherein a material of the first aluminum-based metal layer is selected from at least one of a 1-series aluminum alloy, a 5-series aluminum alloy, a 6-series aluminum alloy, or a 7-series aluminum alloy.

7. The housing according to claim 1, wherein a material of the second aluminum-based metal layer is selected from at least one of a 1-series aluminum alloy to an 8-series aluminum alloy.

8. The housing according to claim 1, wherein a thickness of the housing is T, a thickness of the magnesium-based metal matrix is greater than 0.25 T and less than or equal to 0.95 T, and T is a positive number.

9. The housing according to claim 1, wherein a thickness of the housing is T, and a sum of a thickness of the first aluminum-based metal layer and a thickness of the second aluminum-based metal layer is greater than or equal to 0.05 T and less than or equal to 0.75 T.

10. The housing according to claim 9, wherein the thickness of the first aluminum-based metal layer is greater than or equal to the thickness of the second aluminum-based metal layer.

11. The housing according to claim 1, wherein a thickness of the housing is T, and a thickness of the first metal layer is greater than 0 and less than or equal to 0.2 T.

12. The housing according to claim 1, wherein a thickness of the housing is T, and a thickness of the second metal layer is greater than 0 and less than or equal to 0.2 T.

13. The housing according to claim 1, wherein a thickness of the anodic oxidation layer, the electrophoresis layer, or the ink-jet printing layer ranges from 5 μm to 60 μm.

14. The housing according to claim 1, wherein a material of the conductive surface comprises a partial computer numerical control (CNC) machined or laser engraved surface comprising at least one of a material of the first aluminum-based metal layer, a copper sheet, or electrically conductive foam.

15. The housing according to claim 1, wherein a thickness of an electrical connection layer comprising the electrical connection pads ranges from 0.05 mm to 3 mm.

16. A terminal device, comprising:

a housing comprising a magnesium-based metal matrix, wherein a first aluminum-based metal layer and a second aluminum-based metal layer are respectively disposed on two sides of the magnesium-based metal matrix, a first nickel layer is disposed between the magnesium-based metal matrix and the first aluminum-based metal layer, an anodic oxidation layer, an electrophoresis layer, or an ink-jet printing layer is disposed on a surface of a side that is of the first aluminum-based metal layer and that is away from the first nickel layer, a second nickel layer is disposed between the magnesium-based metal matrix and the second aluminum-based metal layer, and an electrical connection layer is disposed on a surface of a side that is of the second aluminum-based metal layer and that is away from the second nickel layer.

17. The terminal according to claim 16, wherein the layer disposed on the surface of the side that is of the first aluminum-based metal layer and that is away from the first nickel layer comprises the ink-jet printing layer.

18. The terminal according to claim 16, wherein a material of the magnesium-based metal matrix comprises a wrought magnesium alloy.

19. A housing, comprising:

a magnesium-based metal matrix;

a first aluminum-based metal layer and a second aluminum-based metal layer are respectively disposed on two sides of the magnesium-based metal matrix;

a copper layer disposed between the magnesium-based metal matrix and the first aluminum-based metal layer;

an electrophoresis layer disposed on a surface of a side that is of the first aluminum-based metal layer and that is away from the copper layer;

a nickel layer disposed between the magnesium-based metal matrix and the second aluminum-based metal layer; and a conductive surface defining electrical connection pads disposed on a surface of a side that is of the second aluminum-based metal layer and that is away from the nickel layer.

20. The housing of claim 19, wherein the first aluminum-based metal layer and the second aluminum-based metal layer are different materials.

* * * * *